(12) United States Patent
Flynn

(10) Patent No.: US 8,443,134 B2
(45) Date of Patent: May 14, 2013

(54) APPARATUS, SYSTEM, AND METHOD FOR GRACEFUL CACHE DEVICE DEGRADATION

(75) Inventor: David Flynn, Sandy, UT (US)

(73) Assignee: Fusion-io, Inc., Salt Lake City, UT (US)

( * ) Notice: Subject to any disclaimer, the term of this patent is extended or adjusted under 35 U.S.C. 154(b) by 335 days.

(21) Appl. No.: 12/885,285

(22) Filed: Sep. 17, 2010

(65) Prior Publication Data

US 2011/0047437 A1    Feb. 24, 2011

Related U.S. Application Data

(63) Continuation-in-part of application No. 11/952,123, filed on Dec. 6, 2007, now Pat. No. 8,019,938, and a continuation-in-part of application No. 12/877,971, filed on Sep. 8, 2010, and a continuation-in-part of application No. 12/847,952, filed on Jul. 30, 2010.

(60) Provisional application No. 60/873,111, filed on Dec. 6, 2006, provisional application No. 60/974,470, filed on Sep. 22, 2007, provisional application No. 61/240,573, filed on Sep. 8, 2009, provisional application No. 61/240,966, filed on Sep. 9, 2009, provisional application No. 61/373,271, filed on Aug. 12, 2010, provisional application No. 61/368,564, filed on Jul. 28, 2010.

(51) Int. Cl.
*G06F 12/00*    (2006.01)

(52) U.S. Cl.
USPC ............ 711/103; 711/118; 711/142; 711/143

(58) Field of Classification Search ....................... None
See application file for complete search history.

(56) References Cited

U.S. PATENT DOCUMENTS

| | | |
|---|---|---|
| 4,571,674 A | 2/1986 | Hartung |
| 4,980,861 A | 12/1990 | Herdt et al. |
| 5,261,068 A | 11/1993 | Gaskins et al. |

(Continued)

FOREIGN PATENT DOCUMENTS

| | | |
|---|---|---|
| EP | 1100001 | 5/2001 |
| EP | 1418502 | 5/2004 |

(Continued)

OTHER PUBLICATIONS

Application No. PCT/US2011/047659, International Search Report and Written Opinion, Apr. 9, 2012.

(Continued)

*Primary Examiner* — Shawn X Gu
(74) *Attorney, Agent, or Firm* — Jeffrey T. Holman

(57) ABSTRACT

Apparatuses, systems, and methods are disclosed for implementing a cache policy. A method may include determining a risk of data loss on a cache device. The cache device may comprise a non-volatile storage device configured to perform cache functions for a backing store. The cache device may implement a cache policy. A method may include determining that a risk of data loss on the cache devices exceeds a threshold risk level. A method may include implementing a modified cache policy for the cache device in response to the risk of data loss exceeding the threshold risk level. The modified cache policy may reduce the risk of data loss below the threshold level.

22 Claims, 7 Drawing Sheets

| Cache Policy | Write | Read |
|---|---|---|
| Write back | Write to cache device, later write to backing store | Read from cache device |
| Write through | Write to cache device and backing store | Read from cache device |
| Write around | Write to backing store, continue to inject | Read from cache device |
| Read only | Write to backing store, no injection | Read from cache device |
| Bypass | Write to backing store, no injection | Read from backing store |

410

| Cache Device State | Cache Policy | |
|---|---|---|
| | Write | Read |
| Healthy | Use any of the five cache policies | Read from cache device |
| Flashback mode | Use any of the five cache policies | Read from cache device |
| Write reduced mode | Use write through or write around cache policy | Read from cache device |
| Read only mode | Use write around cache policy | Read from cache device |
| Failure | Use bypass cache policy | Read from backing store |

420

U.S. PATENT DOCUMENTS

| | | |
|---|---|---|
| 5,291,496 A | 3/1994 | Andaleon et al. |
| 5,307,497 A | 4/1994 | Feigenbaum et al. |
| 5,313,475 A | 5/1994 | Cromer et al. |
| 5,325,509 A | 6/1994 | Lautzenheiser |
| 5,392,427 A | 2/1995 | Barrett et al. |
| 5,404,485 A | 4/1995 | Ban |
| 5,438,671 A | 8/1995 | Miles |
| 5,469,555 A | 11/1995 | Ghosh et al. |
| 5,499,354 A | 3/1996 | Aschoff et al. |
| 5,504,882 A | 4/1996 | Chai et al. |
| 5,551,003 A | 8/1996 | Mattson et al. |
| 5,559,988 A | 9/1996 | Durante et al. |
| 5,586,291 A | 12/1996 | Lasker et al. |
| 5,594,883 A | 1/1997 | Pricer |
| 5,596,736 A | 1/1997 | Kerns |
| 5,603,001 A | 2/1997 | Sukegawa et al. |
| 5,680,579 A | 10/1997 | Young et al. |
| 5,701,434 A | 12/1997 | Nakagawa |
| 5,734,861 A | 3/1998 | Cohn et al. |
| 5,745,671 A | 4/1998 | Hodges |
| 5,745,792 A | 4/1998 | Jost |
| 5,754,563 A | 5/1998 | White |
| 5,787,486 A | 7/1998 | Chin et al. |
| 5,797,022 A * | 8/1998 | Shimotono et al. ............ 713/323 |
| 5,809,527 A | 9/1998 | Cooper et al. |
| 5,809,543 A | 9/1998 | Byers et al. |
| 5,822,759 A | 10/1998 | Treynor |
| 5,835,935 A | 11/1998 | Estakhri et al. |
| 5,845,313 A | 12/1998 | Estakhri et al. |
| 5,845,329 A | 12/1998 | Onishi et al. |
| 5,860,083 A | 1/1999 | Sukegawa |
| 5,893,138 A | 4/1999 | Judd et al. |
| 5,907,856 A | 5/1999 | Estakhri et al. |
| 5,924,113 A | 7/1999 | Estakhri et al. |
| 5,930,815 A | 7/1999 | Estakhri et al. |
| 5,960,462 A | 9/1999 | Solomon et al. |
| 5,961,660 A | 10/1999 | Capps, Jr. et al. |
| 6,000,019 A | 12/1999 | Dykstal et al. |
| 6,061,511 A | 5/2000 | Marantz et al. |
| 6,073,232 A | 6/2000 | Kroeker et al. |
| 6,101,601 A | 8/2000 | Matthews et al. |
| 6,105,076 A | 8/2000 | Beardsley et al. |
| 6,128,695 A | 10/2000 | Estakhri et al. |
| 6,141,249 A | 10/2000 | Estakhri et al. |
| 6,145,051 A | 11/2000 | Estakhri et al. |
| 6,170,039 B1 | 1/2001 | Kishida |
| 6,170,047 B1 | 1/2001 | Dye |
| 6,172,906 B1 | 1/2001 | Estakhri et al. |
| 6,173,381 B1 | 1/2001 | Dye |
| 6,185,654 B1 | 2/2001 | Van Doren |
| 6,209,088 B1 | 3/2001 | Reneris |
| 6,223,308 B1 | 4/2001 | Estakhri et al. |
| 6,230,234 B1 | 5/2001 | Estakhri et al. |
| 6,240,040 B1 | 5/2001 | Akaogi et al. |
| 6,278,633 B1 | 8/2001 | Wong et al. |
| 6,279,069 B1 | 8/2001 | Robinson et al. |
| 6,289,413 B1 | 9/2001 | Rogers et al. |
| 6,330,688 B1 | 12/2001 | Brown |
| 6,334,173 B1 | 12/2001 | Won et al. |
| 6,356,986 B1 | 3/2002 | Solomon et al. |
| 6,370,631 B1 | 4/2002 | Dye |
| 6,385,710 B1 | 5/2002 | Goldman et al. |
| 6,393,513 B2 | 5/2002 | Estakhri et al. |
| 6,404,647 B1 | 6/2002 | Minne |
| 6,412,080 B1 | 6/2002 | Fleming et al. |
| 6,418,478 B1 | 7/2002 | Ignatius et al. |
| 6,418,509 B1 | 7/2002 | Yanai et al. |
| 6,424,872 B1 | 7/2002 | Glanzer et al. |
| 6,477,617 B1 | 11/2002 | Golding |
| 6,515,928 B2 | 2/2003 | Sato et al. |
| 6,516,380 B2 | 2/2003 | Kenchammana-Hoskote et al. |
| 6,519,185 B2 | 2/2003 | Harari et al. |
| 6,523,102 B1 | 2/2003 | Dye et al. |
| 6,552,955 B1 | 4/2003 | Miki |
| 6,567,889 B1 | 5/2003 | DeKoning et al. |
| 6,587,915 B1 | 7/2003 | Kim |
| 6,601,211 B1 | 7/2003 | Norman |
| 6,608,793 B2 | 8/2003 | Park et al. |
| 6,625,685 B1 | 9/2003 | Cho et al. |
| 6,633,956 B1 | 10/2003 | Mitani |
| 6,671,757 B1 | 12/2003 | Multer et al. |
| 6,675,349 B1 | 1/2004 | Chen |
| 6,710,901 B2 | 3/2004 | Pastor |
| 6,715,046 B1 | 3/2004 | Shoham et al. |
| 6,728,851 B1 | 4/2004 | Estakhri et al. |
| 6,735,546 B2 | 5/2004 | Scheuerlein |
| 6,745,292 B1 | 6/2004 | Stevens |
| 6,751,155 B2 | 6/2004 | Gorobets |
| 6,754,774 B2 | 6/2004 | Gruner et al. |
| 6,754,800 B2 | 6/2004 | Wong et al. |
| 6,757,800 B1 | 6/2004 | Estakhri et al. |
| 6,760,806 B2 | 7/2004 | Jeon |
| 6,775,185 B2 | 8/2004 | Fujisawa et al. |
| 6,779,088 B1 | 8/2004 | Benveniste et al. |
| 6,779,094 B2 | 8/2004 | Selkirk et al. |
| 6,785,776 B2 | 8/2004 | Arimilli et al. |
| 6,785,785 B2 | 8/2004 | Piccirillo et al. |
| 6,801,979 B1 | 10/2004 | Estakhri |
| 6,804,755 B2 | 10/2004 | Selkirk et al. |
| 6,816,917 B2 | 11/2004 | Dicorpo et al. |
| 6,839,819 B2 | 1/2005 | Martin |
| 6,845,053 B2 | 1/2005 | Chevallier |
| 6,845,428 B1 | 1/2005 | Kedem |
| 6,871,257 B2 | 3/2005 | Conley et al. |
| 6,877,076 B1 | 4/2005 | Cho et al. |
| 6,880,049 B2 | 4/2005 | Gruner et al. |
| 6,883,068 B2 | 4/2005 | Tsirigotis et al. |
| 6,883,069 B2 | 4/2005 | Yoshida |
| 6,883,079 B1 | 4/2005 | Priborsky |
| 6,910,170 B2 | 6/2005 | Choi et al. |
| 6,912,537 B2 | 6/2005 | Selkirk et al. |
| 6,912,618 B2 | 6/2005 | Estakhri et al. |
| 6,922,754 B2 | 7/2005 | Liu et al. |
| 6,928,505 B1 | 8/2005 | Klingman |
| 6,938,133 B2 | 8/2005 | Johnson et al. |
| 6,977,599 B2 | 12/2005 | Widmer |
| 6,978,342 B1 | 12/2005 | Estakhri et al. |
| 6,981,070 B1 | 12/2005 | Luk |
| 6,996,676 B2 | 2/2006 | Megiddo |
| 7,000,063 B2 | 2/2006 | Friedman et al. |
| 7,010,652 B2 | 3/2006 | Piccirillo et al. |
| 7,010,662 B2 | 3/2006 | Aasheim et al. |
| 7,010,663 B2 | 3/2006 | George et al. |
| 7,013,376 B2 | 3/2006 | Hooper, III |
| 7,013,379 B1 | 3/2006 | Testardi |
| 7,043,599 B1 | 5/2006 | Ware et al. |
| 7,047,366 B1 | 5/2006 | Ezra |
| 7,050,337 B2 | 5/2006 | Iwase et al. |
| 7,057,936 B2 | 6/2006 | Yaegashi et al. |
| 7,058,769 B1 | 6/2006 | Danilak |
| 7,069,380 B2 | 6/2006 | Ogawa et al. |
| 7,076,723 B2 | 7/2006 | Saliba |
| 7,082,495 B2 | 7/2006 | DeWhitt et al. |
| 7,082,512 B2 | 7/2006 | Aasheim et al. |
| 7,085,879 B2 | 8/2006 | Aasheim et al. |
| 7,089,391 B2 | 8/2006 | Geiger et al. |
| 7,093,101 B2 | 8/2006 | Aasheim et al. |
| 7,096,321 B2 | 8/2006 | Modha |
| 7,111,140 B2 | 9/2006 | Estakhri et al. |
| 7,130,956 B2 | 10/2006 | Rao |
| 7,130,957 B2 | 10/2006 | Rao |
| 7,143,228 B2 | 11/2006 | Iida et al. |
| 7,149,947 B1 | 12/2006 | MacLellan et al. |
| 7,162,571 B2 | 1/2007 | Kilian et al. |
| 7,167,944 B1 | 1/2007 | Estakhri |
| 7,167,953 B2 | 1/2007 | Megiddo |
| 7,177,197 B2 | 2/2007 | Cernea |
| 7,178,081 B2 | 2/2007 | Lee et al. |
| 7,181,572 B2 | 2/2007 | Walmsley |
| 7,194,577 B2 | 3/2007 | Johnson et al. |
| 7,197,567 B1 | 3/2007 | Fitzgerald |
| 7,203,815 B2 | 4/2007 | Haswell |
| 7,215,580 B2 | 5/2007 | Gorobets |
| 7,219,197 B2 | 5/2007 | Hatakeyama |
| 7,219,238 B2 | 5/2007 | Saito et al. |
| 7,227,777 B2 | 6/2007 | Roohparvar |
| 7,234,082 B2 | 6/2007 | Lai et al. |

| Patent No. | Date | Inventor |
|---|---|---|
| 7,237,141 B2 | 6/2007 | Fredin |
| 7,243,203 B2 | 7/2007 | Scheuerlein |
| 7,246,179 B2 | 7/2007 | Camara |
| 7,248,691 B1 | 7/2007 | Pandit et al. |
| 7,257,129 B2 | 8/2007 | Lee et al. |
| 7,263,591 B2 | 8/2007 | Estakhri et al. |
| 7,280,536 B2 | 10/2007 | Testardi |
| 7,305,520 B2 | 12/2007 | Voigt et al. |
| 7,337,201 B1 | 2/2008 | Yellin et al. |
| 7,340,558 B2 | 3/2008 | Lee et al. |
| 7,340,566 B2 | 3/2008 | Voth |
| 7,340,581 B2 | 3/2008 | Gorobets et al. |
| 7,356,651 B2 | 4/2008 | Liu et al. |
| 7,360,015 B2 | 4/2008 | Matthews et al. |
| 7,360,037 B2 | 4/2008 | Higaki et al. |
| 7,366,808 B2 | 4/2008 | Kano et al. |
| 7,370,163 B2 | 5/2008 | Yang et al. |
| 7,392,365 B2 | 6/2008 | Selkirk et al. |
| 7,424,593 B2 | 9/2008 | Estakhri et al. |
| 7,437,510 B2 | 10/2008 | Rosenbluth et al. |
| 7,441,081 B2 | 10/2008 | Humlicek |
| 7,441,090 B2 | 10/2008 | Estakhri et al. |
| 7,447,847 B2 | 11/2008 | Louie et al. |
| 7,450,420 B2 | 11/2008 | Sinclair |
| 7,460,432 B2 | 12/2008 | Warner |
| 7,463,521 B2 | 12/2008 | Li |
| 7,480,766 B2 | 1/2009 | Gorobets |
| 7,487,235 B2 | 2/2009 | Andrews et al. |
| 7,487,320 B2 | 2/2009 | Bansal et al. |
| 7,500,000 B2 | 3/2009 | Groves et al. |
| 7,523,249 B1 | 4/2009 | Estakhri et al. |
| 7,529,905 B2 | 5/2009 | Sinclair |
| 7,536,491 B2 | 5/2009 | Kano et al. |
| 7,549,013 B2 | 6/2009 | Estakhri et al. |
| 7,552,271 B2 | 6/2009 | Sinclair |
| 7,580,287 B2 | 8/2009 | Aritome |
| 7,631,138 B2 | 12/2009 | Gonzalez et al. |
| 7,640,390 B2 | 12/2009 | Iwamura et al. |
| 7,644,239 B2 | 1/2010 | Ergan et al. |
| 7,660,911 B2 | 2/2010 | McDaniel |
| 7,689,803 B2 | 3/2010 | Karr et al. |
| 7,725,628 B1 | 5/2010 | Phan |
| 7,725,661 B2 | 5/2010 | Liu et al. |
| 7,856,528 B1 | 12/2010 | Frost |
| 7,873,782 B2 | 1/2011 | Terry |
| 7,908,501 B2 | 3/2011 | Kim et al. |
| 2002/0069317 A1 | 6/2002 | Chow et al. |
| 2002/0069318 A1 | 6/2002 | Chow et al. |
| 2002/0194451 A1 | 12/2002 | Mukaida et al. |
| 2003/0061296 A1 | 3/2003 | Craddock et al. |
| 2003/0093741 A1 | 5/2003 | Argon et al. |
| 2003/0131182 A1 | 7/2003 | Kumar et al. |
| 2003/0163633 A1 | 8/2003 | Aasheim et al. |
| 2003/0198084 A1 | 10/2003 | Fujisawa et al. |
| 2004/0059870 A1 | 3/2004 | Ash et al. |
| 2004/0093463 A1 | 5/2004 | Shang |
| 2004/0186946 A1 | 9/2004 | Lee |
| 2004/0268359 A1 | 12/2004 | Hanes |
| 2005/0002263 A1 | 1/2005 | Iwase et al. |
| 2005/0015539 A1 | 1/2005 | Horii et al. |
| 2005/0027951 A1 | 2/2005 | Piccirillo et al. |
| 2005/0055497 A1 | 3/2005 | Estakhri et al. |
| 2005/0076107 A1 | 4/2005 | Goud et al. |
| 2005/0132259 A1 | 6/2005 | Emmot et al. |
| 2005/0144361 A1 | 6/2005 | Gonzalez et al. |
| 2005/0149618 A1 | 7/2005 | Cheng |
| 2005/0149819 A1 | 7/2005 | Hwang |
| 2005/0177672 A1 | 8/2005 | Rao |
| 2005/0177687 A1 | 8/2005 | Rao |
| 2005/0193166 A1 | 9/2005 | Johnson et al. |
| 2005/0229090 A1 | 10/2005 | Shen et al. |
| 2005/0235132 A1 | 10/2005 | Karr et al. |
| 2005/0240713 A1 | 10/2005 | Wu |
| 2005/0246510 A1 | 11/2005 | Retnamma et al. |
| 2005/0257213 A1 | 11/2005 | Chu et al. |
| 2005/0276092 A1 | 12/2005 | Hansen et al. |
| 2006/0004955 A1 | 1/2006 | Ware et al. |
| 2006/0026339 A1 | 2/2006 | Rostampour |
| 2006/0075057 A1 | 4/2006 | Gildea et al. |
| 2006/0090048 A1 | 4/2006 | Okumoto et al. |
| 2006/0090948 A1 | 5/2006 | Allen |
| 2006/0106968 A1 | 5/2006 | Wooi Teoh |
| 2006/0106990 A1 | 5/2006 | Benhase et al. |
| 2006/0143396 A1 | 6/2006 | Cabot |
| 2006/0152981 A1 | 7/2006 | Ryu |
| 2006/0184736 A1 | 8/2006 | Benhase et al. |
| 2006/0224849 A1 | 10/2006 | Islam et al. |
| 2006/0230295 A1 | 10/2006 | Schumacher et al. |
| 2006/0248387 A1 | 11/2006 | Nicholson et al. |
| 2006/0265624 A1 | 11/2006 | Moshayedi et al. |
| 2007/0016699 A1 | 1/2007 | Minami |
| 2007/0050571 A1 | 3/2007 | Nakamura |
| 2007/0061515 A1 | 3/2007 | Kano |
| 2007/0118676 A1 | 5/2007 | Kano |
| 2007/0124474 A1 | 5/2007 | Margulis |
| 2007/0124540 A1 | 5/2007 | van Riel |
| 2007/0150689 A1 | 6/2007 | Pandit |
| 2007/0162830 A1 | 7/2007 | Stek et al. |
| 2007/0198770 A1 | 8/2007 | Horii et al. |
| 2007/0204128 A1 | 8/2007 | Lee |
| 2007/0204197 A1 | 8/2007 | Yokokawa |
| 2007/0230253 A1 | 10/2007 | Kim |
| 2007/0233455 A1 | 10/2007 | Zimmer et al. |
| 2007/0233937 A1 | 10/2007 | Coulson et al. |
| 2007/0233938 A1 | 10/2007 | Cho et al. |
| 2007/0234021 A1 | 10/2007 | Ruberg et al. |
| 2007/0245094 A1 | 10/2007 | Lee et al. |
| 2007/0245217 A1 | 10/2007 | Valle |
| 2007/0250660 A1 | 10/2007 | Gill et al. |
| 2007/0271468 A1 | 11/2007 | McKenney et al. |
| 2007/0271572 A1 | 11/2007 | Gupta et al. |
| 2007/0274150 A1 | 11/2007 | Gorobets |
| 2007/0276897 A1 | 11/2007 | Tameshige et al. |
| 2007/0300008 A1 | 12/2007 | Rogers |
| 2008/0005748 A1 | 1/2008 | Mathew et al. |
| 2008/0010395 A1 | 1/2008 | Mylly et al. |
| 2008/0016301 A1 | 1/2008 | Chen |
| 2008/0043769 A1 | 2/2008 | Hirai |
| 2008/0052483 A1 | 2/2008 | Rangarajan et al. |
| 2008/0059752 A1 | 3/2008 | Serizawa |
| 2008/0059820 A1 | 3/2008 | Vaden et al. |
| 2008/0080243 A1 | 4/2008 | Edahiro et al. |
| 2008/0091876 A1 | 4/2008 | Fujibayashi et al. |
| 2008/0098159 A1 | 4/2008 | Song |
| 2008/0104344 A1 | 5/2008 | Shimozono et al. |
| 2008/0117686 A1 | 5/2008 | Yamada |
| 2008/0120469 A1 | 5/2008 | Kornegay et al. |
| 2008/0123211 A1 | 5/2008 | Chng et al. |
| 2008/0126700 A1 | 5/2008 | El-Batal et al. |
| 2008/0126852 A1 | 5/2008 | Brandyberry et al. |
| 2008/0133963 A1 | 6/2008 | Katano et al. |
| 2008/0137658 A1 | 6/2008 | Wang |
| 2008/0140819 A1 | 6/2008 | Bailey et al. |
| 2008/0183965 A1 | 7/2008 | Shiga et al. |
| 2008/0195801 A1 | 8/2008 | Cheon et al. |
| 2008/0201535 A1 | 8/2008 | Hara |
| 2008/0205286 A1 | 8/2008 | Li et al. |
| 2008/0209090 A1 | 8/2008 | Kano et al. |
| 2008/0229046 A1 | 9/2008 | Raciborski |
| 2008/0235443 A1 | 9/2008 | Chow et al. |
| 2008/0235528 A1 | 9/2008 | Kim et al. |
| 2008/0266973 A1 | 10/2008 | Sekar et al. |
| 2008/0276040 A1 | 11/2008 | Moritoki |
| 2008/0294847 A1 | 11/2008 | Maruyama et al. |
| 2008/0313364 A1 | 12/2008 | Flynn et al. |
| 2009/0043952 A1 | 2/2009 | Estakhri et al. |
| 2009/0070541 A1 | 3/2009 | Yochai |
| 2009/0083478 A1 | 3/2009 | Kunimatsu et al. |
| 2009/0083485 A1 | 3/2009 | Cheng |
| 2009/0089485 A1 | 4/2009 | Yeh |
| 2009/0089518 A1 | 4/2009 | Hobbet et al. |
| 2009/0091996 A1 | 4/2009 | Chen et al. |
| 2009/0125650 A1 | 5/2009 | Sebire |
| 2009/0144496 A1 | 6/2009 | Kawaguchi |
| 2009/0150605 A1 | 6/2009 | Flynn et al. |
| 2009/0150621 A1 | 6/2009 | Lee |
| 2009/0157956 A1 | 6/2009 | Kano |
| 2009/0204750 A1 | 8/2009 | Estakhri et al. |

| | | | |
|---|---|---|---|
| 2009/0228637 | A1 | 9/2009 | Moon et al. |
| 2009/0235017 | A1 | 9/2009 | Estakhri et al. |
| 2009/0276654 | A1 | 11/2009 | Butterworth |
| 2009/0300277 | A1 | 12/2009 | Jeddeloh |
| 2009/0313453 | A1 | 12/2009 | Stefanus et al. |
| 2009/0327602 | A1 | 12/2009 | Moore et al. |
| 2009/0327804 | A1 | 12/2009 | Moshayedi |
| 2010/0017556 | A1 | 1/2010 | Chin et al. |
| 2010/0023674 | A1 | 1/2010 | Aviles |
| 2010/0023676 | A1 | 1/2010 | Moon et al. |
| 2010/0023682 | A1 | 1/2010 | Lee et al. |
| 2010/0030946 | A1 | 2/2010 | Kano et al. |
| 2010/0077194 | A1 | 3/2010 | Zhao et al. |
| 2010/0102999 | A1 | 4/2010 | Lee et al. |
| 2010/0106917 | A1 | 4/2010 | Ruberg et al. |

FOREIGN PATENT DOCUMENTS

| | | |
|---|---|---|
| EP | 1814039 | 8/2007 |
| GB | 1995018407 | 7/1995 |
| GB | 0123416.0 | 11/2002 |
| JP | 04-242848 | 8/1992 |
| JP | 08-153014 | 6/1996 |
| JP | 2000259525 | 9/2000 |
| JP | 2009122850 | 6/2009 |
| KR | 1020100022811 | 3/2010 |
| WO | 9419746 | 9/1994 |
| WO | 9612225 | 4/1996 |
| WO | 0131512 | 5/2001 |
| WO | 0201365 | 1/2002 |
| WO | 2008070173 | 6/2008 |
| WO | 2008073421 | 6/2008 |
| WO | 2010036757 | 4/2010 |

OTHER PUBLICATIONS

Application No. 200780050973.4, First Office Action, Jan. 26, 2011.
Application No. 07867661.6, Office Action, Jun. 10, 2011.
"Windows PC Accelerators", Nov. 30, 2006, pp. 1-16, XP002476842, URL:http://download.microsoft.com/download/9/c/5/9c5b2167-8017-4bae-9fde-d599bac8184a/perfaccel.doc.
Application No. PCT/US2007/025049, International Preliminary Report on Patentability, Mar. 11, 2009.
Application No. PCT/US2007/025049, International Search Report and Written Opinion, May 14, 2008.
"Am29DL322D/323D/324D", Data Sheet, Spansion, XP-002476181, Oct. 7, 2004, Publication No. 21534, Revision D, Amendment #7.
Ari, Ismail, "Performance Boosting and Workload Isolation in Storage Area Networks with SANCache", Proceedings of the 23rd IEEE/14th NASA Goddard Conference on Mass Storage Systems and Technologies, May 2006, pp. 263-273, College Park, Maryland, US.
"ASPMC-660 Rugged IDE Flash Disk PMC Module", Asine, downloaded Nov. 18, 2009, pp. 3, http://www.asinegroup.com/products/aspmc660html.
Bandulet, Christian, "Object-Based Storage Devices", Sun Developer Network, Jul. 2007, pp. 7, http://developers.xun/com/solaris/articles/osd.html.
"BiTMICRO Introduces E-Disk PMC Flash Disk Module", Military and Aerospace Electronics East, 2004, pp. 2, http://www.bitmicro.com/press_news_releases?20040518/prt.php.
Bulletproof Memory for RAID Servers, Part 1-3, agigatech com., 2009, pp. 12, http://agigatech.com/blog/bulletproof-memory-for-raid-servers-part-1/3.
Casey, Michael, "Solid State File-Caching for Performance and Scalability", Solidata, downloaded Jan. 5, 2011, pp. 5, http://www.storagesearch.com/3dram.html.
"S2A9550 Overview", White Paper, DataDirect Networks, 2007, pp. 17, Chatsworth, California, US.
Casey, Michael, "Disk I/O Performance Scaling: the File Caching Solution", Solid Data Systems, Inc., Paper #528, pp. 8.
"EMC Virtual Infrastructure for Microsoft Applications—Data Center Solution Enabled by EMC Symmetrix V-Max and VMware ESC 3.5", White Paper, EMC, Apr. 2009, pp. 30.
Feresten, Paul, "NETAPP Thin Provisioning: Better for Business", NETAPP White Paper, Network Appliance, Inc., Mar. 2007, WP-7017-0307, pp. 11.

"File System Primer", CoolSolutionsWiki, downloaded Oct. 18, 2006, pp. 5, http://wiki.novell.com/index.php/File_System_Primer.
Gill, Binny S., "WOW: Wise Ordering for Writes—Combining Spatial and Temporal Locality in Non-Volatile Caches", IBM Almaden Research Center, San Jose, California, US.
Van Hensbergen, Eric, "Dynamic Policy Disk Caching for Storage Networking", IBM Research Report, Nov. 28, 2006, pp. 13, RC24123 (W0611-189).
"How NTFS Works", Updated Mar. 28, 2003, pp. 34, http://technet.microsoff.com/en-us/library/cc781134(WS.10).aspx.
Dan, Raz, "Implementing MLC NAND Flash for Cost-Effective, High-Capacity Memory", White Paper M-Systems, Sep. 2003, pp. 13, 92-SR-014-02-8L, Rev. 1.1, Newark, California, US.
Weber, Ralph O., "Information Technology-SCSI Object-Based Storage Device Commands (OSD)", Seagate Technology, Jul. 30, 2004, pp. 171, Project T10/1355-D, Revision 10, Reference No. ISO/IEC 14776-391 : 200x ANSI INCITS.***:200x.
"Intel Turbo Memory with User Pinning", Intel NAND Storage Solutions, 2008, pp. 4, www.intel.com/go/nand.
"Introduction to Samsung's Linux Flash File System—RFS", Samsung Electronics Application Note, Nov. 2006, Version 1.0, pp. 6.
"ioDrive—Frequently Asked Questions", Clustered Storage Solutions: Products, downloaded Feb. 16, 2010, pp. 2, http://www.clusteredstorage.com/clustered_storage_solutions.html.
Johnson, Michael K., "An Introduction to Block Device Drivers", Jan. 1, 1995, pp. 6.
Kawaguchi, Atsuo, "A Flash-Memory Based File System", Advanced Research Laboratory, Hitachi, Ltd., Hatoyama, Saitama, JP.
Leventhal, Adam, "Flash Storage Memory", Communications of the ACM, Jul. 2008, pp. 47-51, vol. 51, No. 7.
"Method for Fault Tolerance in Nonvolatile Storage", ip.com PriorArtDatabase Technical Disclosure, Feb. 3, 2005, pp. 6, IPCOM000042269D, www.ip.com.
IBM, "Method to Improve Reliability of SSD Arrays", ip.com PriorArtDatabase Technical Disclosure, Nov. 5, 2009, pp. 6, IPCOM000189338D, www.ip.com.
Volos, Haris, "Mnemosyne: Lightweight Persistent Memory", ASPLOS'11, Mar. 5-11, 2011, pp. 13, Newport Beach, California, US.
Morgenstern, David, "Is There a Flash Memory RAID in Your Future?" Ziff Davis Enterprise Holdings, Inc., Nov. 8, 2006, pp. 4, http://www.eweek.com.
"NAND Flash 101: An Introduction to NAND Flash and How to Design It in to Your Next Product", Micron Technical Note, Rev. A 11/06, pp. 28, TN-29-19: NAND Flash 101.
Coburn, Joel, "NV-Heaps: Making Persistent Objects Fast and Safe with Next-Generation, Non-Volatile Memories", ASPLOS'II, Mar. 5-11, 2011, pp. 13, Newport Beach, California, US.
Wu, Michael, "eNVy: A Non-Volatile, Main Memory Storage System", Rice University, 1994, pp. 86-97, San Jose, California, US.
Yerrick, Damian, "Block Device", downloaded Mar. 1, 2010, pp. 3, http://www.pineight.com/ds/block/.
Application No. PCT/US2012/022244, International Search Report and Written Opinion, Jul. 30, 2012.
Application No. 11952123, Office Action, May 5, 2010.
Application No. PCT/US2011/046005, International Search Report and Written Opinion, Apr. 6, 2012.
Application No. 11952123, Office Action, May 10, 2010.
Application No. 07867661.6, Office Action, Oct. 10, 2011.
"EEL-6892—Virtual Computers", Lecture 18, http://www.acis.ufl.edu/ming/lectures.
"Hystor: Making SSDs the 'Survival of the Fittest' in High-Performance Storage Systems", pp. 14.
Application No. 11952123, Notice of Allowance, May 5, 2011.
"Datadirect Storage Systems Selected for NCSA Cluster", High Performance Computing, Aug. 15, 2003, pp. 2, vol. 12, No. 32, http://www.hpcwire/com/hpcwire/hpcwireWWW/03/0815/105731.html.
"Introducing Box Hill's Fibre Box", Box Hill Systems Corporation, Jan. 16, 1997, p. 5.

Makulowich, John, "Strategies, Players and Emerging Markets", Washington Technology, Jun. 26, 1997, pp. 6, http://washingtontechnology.com/Articles/1997/06/26/Strategies-Players-and-Emerging-Ma. . .

Application No. PCT/US2010/048321, International Search Report and Written Opinion, Apr. 28, 2011.

"jZip A Free WinZip Alternative", First jZip by Greg Kowal, 2012.

Megiddo, Nimrod, "ARC: A Self-Tuning, Low Overhead Replacement Cache", Proceedings of FAST '03: 2nd USENIX Conference on File and Storage Technologies, Mar. 31-Apr. 2, 2003, pp. 17, San Francisco, California, US.

Whyte, Barry, "IBM SAN Volume Controller 4.2.1 Cache Partitioning", Redpaper, Apr. 30, 2008, pp. 12, REDP-4426-00.

Brandon, Jr., Daniel, "Sparse Matrices in CS Education", Consortium for Computing Sciences in Colleges, May 2009, pp. 93-98.

"Pivot3 RAIGE Storage Cluster", White Paper Technology Overview, Jun. 2007, pp. 17, www.pivot3.com.

Plank, James S., "A Tutorial on Reed-Solomon Coding for Fault-Tolerance in RAID-like Systems", pp. 19, Technical Report CS-96-332, Department of Computer Science, University of Tennessee, http://www.cs.utk.edu/plank/papers/CS-03-504.html.

Rosenblum, Mendel, "The Design and Implementation of a Log-structured File System", 1992, pp. 101.

Casey, Michael, "SAN Cache: SSD in the SAN", Computer Technology Review's Storage Inc., Quarter 1, 2000, pp. 4, SolidData, Santa Clara, California, US.

Hynix 48-GB Flash MCP, Slashdot, downloaded Nov. 4, 2010, pp. 17, http://hardware.slashdot.org/article.pl?sid=07/09/06/146218&from=rss.

"Sybase: Maximizing Performance through Solid State File-Caching", SolidData Systems Best Practices Guide, May 2000, pp. 4, Santa Clara, California, US.

Stokes, Jon, "Intel's New Flash Tech to Bring Back Turbo Memory, For Real", downloaded Apr. 23, 2012, pp. 2, http://arstechnica.com/hardware/news/2009/09intels-new-flash-tech-to-b . . .

"Design and Use Considerations for NAND Flash Memory", Micron Technical Note, 2006, pp. 8, TN-29-17: NAND Flash Design and Use Considerations.

"Hamming Codes for NAND Flash Memory Devices", Micron Technical Note, 2005, pp. 7, TN-29-08: Hamming Codes for NAND Flash Memory Devices.

"The Advantages of Object-Based Storage—Secure, Scalable, Dynamic Storage Devices", Seagate Research, Apr. 2005, pp. 7, TP-536.

Wacha, Rosie, "Improving RAID-Based Storage Systems with Flash Memory", First Annual ISSDM/SRL Research Symposium, Oct. 20, 21, 2009, pp. 21.

Wang, Feng, "OBFS: A File System for Object-based Storage Devices", 21st IEEE/12th NASA Goddard Conference on Mass Storage Systems and Technologies (MSST2004), Apr. 2004, pp. 18, College Park, Maryland, US.

Woodhouse, David, "JFFS: The Journalling Flash File System", Red Hat, Inc., pp. 12, dwmw2@cambridge.redhat.com.

Mesnier, Mike, "Object-Based Storage", IEEE Communications Magazine, Aug. 2003, pp. 84-90.

* cited by examiner

| Cache Policy | Write | Read |
|---|---|---|
| Write back | Write to cache device, later write to backing store | Read from cache device |
| Write through | Write to cache device and backing store | Read from cache device |
| Write around | Write to backing store, continue to inject | Read from cache device |
| Read only | Write to backing store, no injection | Read from cache device |
| Bypass | Write to backing store, no injection | Read from backing store |

410

| Cache Device State | Cache Policy | |
|---|---|---|
| | Write | Read |
| Healthy | Use any of the five cache policies | Read from cache device |
| Flashback mode | Use any of the five cache policies | Read from cache device |
| Write reduced mode | Use write through or write around cache policy | Read from cache device |
| Read only mode | Use write around cache policy | Read from cache device |
| Failure | Use bypass cache policy | Read from backing store |

APPARATUS, SYSTEM, AND METHOD FOR GRACEFUL CACHE DEVICE DEGRADATION

CROSS-REFERENCES TO RELATED APPLICATIONS

This application is a continuation in part of, and claims priority to, the following U.S. patents, each of which is incorporated by reference:

U.S. patent application Ser. No. 11/952,123 entitled "Apparatus, System, and Method for Solid-State Storage as Cache for High-Capacity, Non-Volatile Storage" and filed Dec. 6, 2007 for David Flynn, et al., which patent application claims priority to U.S. provisional patent application No. 60/873,111 entitled "Elemental Blade System" filed on Dec. 6, 2006 for David Flynn et al., and U.S. provisional patent application No. 60/974,470 entitled "Apparatus, System, and Method for Object-Oriented Solid-State Storage" filed on Sep. 22, 2007 for David Flynn et al;

U.S. patent application Ser. No. 12/877,971 entitled "Apparatus, System, and Method for Caching Data on a Solid-State Storage Device" filed on Sep. 8, 2010 for David Flynn et al., which patent application claims priority to U.S. provisional patent application No. 61/240,573 entitled "Apparatus, System, and Method for an Improved Nonvolatile Caching Device" filed on Sep. 8, 2009 for David Flynn et al., and U.S. provisional patent application No. 61/240,966 entitled "Apparatus, System, and Method for Allocating Solid-State Storage" filed on Sep. 9, 2009, for Jonathan Thatcher et al., and U.S. provisional patent application No. 61/373,271 entitled "Apparatus, System, and Method for Caching Data" filed on Aug. 12, 2010 for David Flynn; and U.S. patent application Ser. No. 12/847,952 entitled "Apparatus, System, and Method for Redundant Write Caching" filed on Jul. 30, 2010 for David Flynn et al., which patent application is a continuation-in-part of and claims priority to U.S. patent application Ser. No. 11/952,123 entitled "Apparatus, System, and Method for Solid-State Storage as Cache for High-Capacity, Non-Volatile Storage" and filed on Dec. 6, 2007 for David Flynn, et al., and U.S. provisional patent application No. 61/240,573 entitled "Apparatus, System, and Method for an Improved Nonvolatile Caching Device" and filed on Sep. 8, 2009 for David Flynn, et al. U.S. patent application Ser. No. 11/952,123 is a continuation in part of and claims priority to U.S. provisional patent application No. 60/873,111 filed on Dec. 6, 2006 and U.S. provisional patent application No. 60/974,470 filed on Sep. 22, 2007.

This application also claims priority to the following U.S. provisional patent applications, each of which is incorporated by reference:

U.S. provisional patent application No. 61/368,564 entitled "Apparatus, System, and Method for Writing Data to Storage Media in a Single Atomic Operation" filed on Jul. 28, 2010 for David Flynn et al.; and U.S. provisional patent application No. 61/373,271 entitled "Apparatus, System, and Method for Caching Data" filed on Aug. 12, 2010 for David Flynn.

BACKGROUND

1. Field of the Invention

This invention relates to allocation of data storage and more particularly relates to allocation of data storage at a storage device.

2. Description of the Related Art

Computers and storage systems (such as storage area networks (SANs)) often make use of cache to speed data writing and retrieval. Due to the cost associated with devices that have sufficient speed to act as effective cache, the amount of memory available as cache is often limited. Solid state storage (such as Flash) may be used to provide relatively affordable, high-speed and fast caching memory. Hard drives may be used as cache in front of slower media such as tape.

However, many types of storage media degrade with time. For example, Flash memory has a limited life cycle; the reliability of the Flash memory degrades as the read-write cycles increase. The device becomes increasingly unreliable as a storage device with use, and eventually dies completely. The limited life cycle of physical devices (whether solid state memory or hard disk) reduces its ability to act as effective cache. Since an effective storage system should be able to guarantee, with a high degree of reliability, that data written to the system will not be lost, using a cache device that degrades with time can cause difficulty. The possibility of losing data is an impediment to the acceptance and implementation of non-volatile memory as cache. It can also increase costs as administrators need to replace cache devices (even if they may be functional) because the risk of data loss associated with continued use of the cache device is simply too high. Furthermore, attempting to write data to a cache device, and read data from a cache device, when that data is no longer trustworthy, unnecessarily increases traffic and overhead on a storage system.

SUMMARY

Methods for caching using a nonvolatile storage device are presented. In one embodiment, a method includes determining a risk of data loss on a cache device. The cache device, in certain embodiments, is a non-volatile storage device configured to perform cache functions for a backing store. The cache device, in a further embodiment, implements a cache policy. A method, in one embodiment, includes determining that the risk of data loss on the cache device exceeds a threshold risk level. In a further embodiment, a method includes implementing a modified cache policy for the cache device in response to the risk of data loss exceeding the threshold risk level. The modified cache policy, in certain embodiments, reduces the risk of data loss below the threshold risk level.

Apparatuses are presented for caching using a nonvolatile storage device. In one embodiment, a direct cache in configured for communication with a cache device and a backing store. A cache device, in certain embodiments, is a non-volatile storage device configured to perform cache functions for a backing store. A direct cache, in one embodiment, includes a monitor module configured for determining a risk of data loss on the cache device. In a further embodiment, a direct cache includes a cache policy module configured for implementing a modified cache policy for the cache device if a risk of data loss on the cache device exceeds a threshold risk level. A direct cache, in certain embodiments, is configured to receive, from the cache device, one or more indicators associated with the risk of data loss on the cache device.

Systems are presented for caching using a nonvolatile storage device. In one embodiment, a backing store is configured for storing data received from one or more storage clients. A backing store, in certain embodiments, comprises one or more non-volatile storage devices. A cache device, in one embodiment, is configured for performing cache functions for the backing store. A cache device, in a further embodiment, is a non-volatile storage device with faster access characteristics than those of the backing store. In another embodiment, a cache device is configured to implement a cache policy. A direct cache, in one embodiment, is configured for determining a risk of data loss on a cache device. A direct cache, in a further embodiment, is configured for determining that the risk of data loss on a cache device exceeds a threshold risk level. In another embodiment, a direct cache is configured for implementing a modified cache policy for a cache device in response to the risk of data loss exceeding the threshold risk level. The modified cache policy, in certain embodiments, reduces the risk of data loss below the threshold risk level.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which:

FIG. 4 is an illustration of two exemplary tables specifying possible cache policies and associated cache device states;

DETAILED DESCRIPTION

Figure 1:
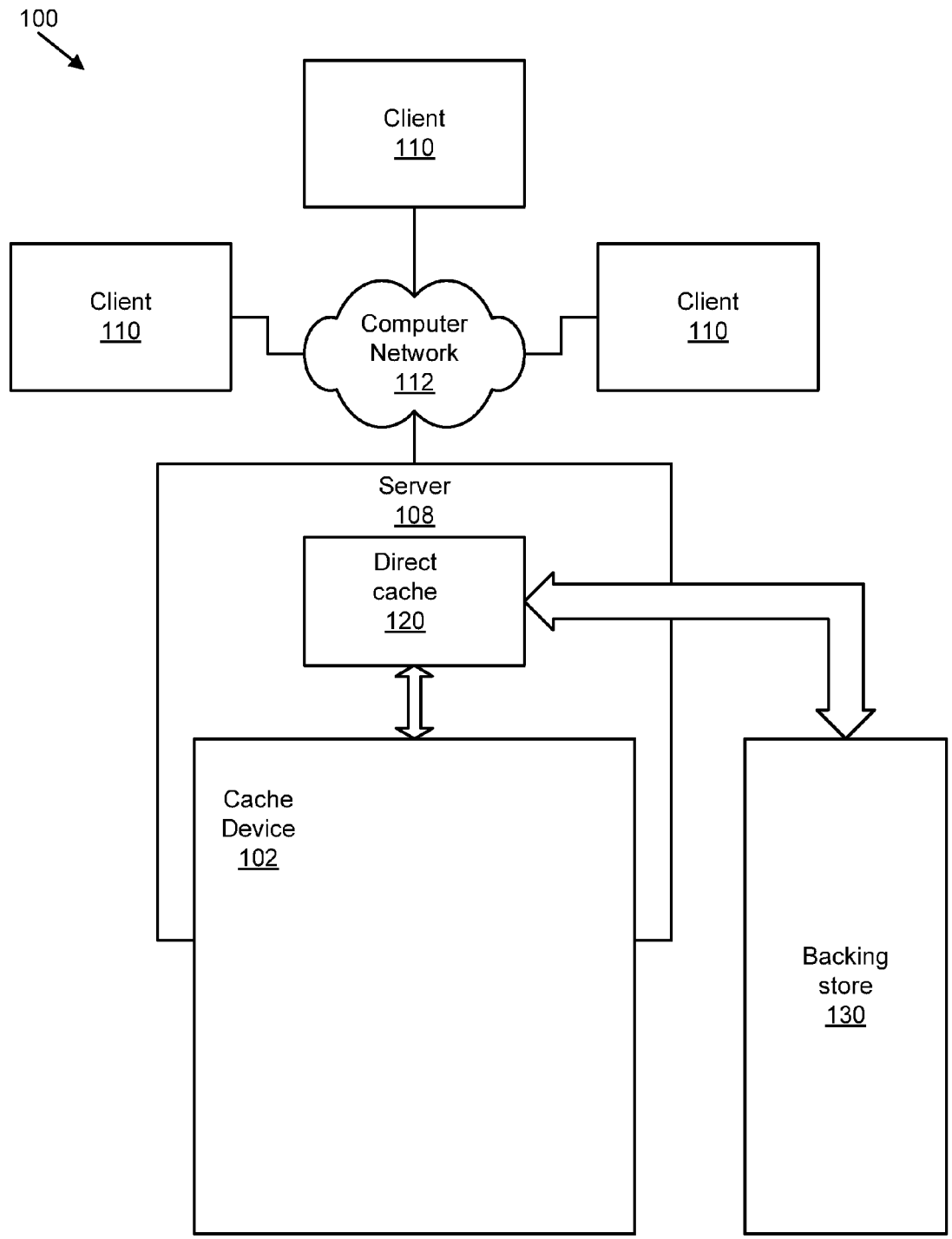
FIG. 1 is a schematic block diagram illustrating one embodiment of a system with graceful cache degradation.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus. A computer readable medium may be embodied by a transmission line, a compact disk, digital-video disk, a magnetic tape, a Bernoulli drive, a magnetic disk, a punch card, flash memory, integrated circuits, or other digital processing apparatus memory device. The word "may" is used in this application to express possibility, and should not be interpreted as expressing opportunity, permission, or contingency.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

FIG. 1 illustrates one embodiment of a system 100 which may benefit from graceful cache degradation. In the depicted embodiment, the system 100 includes clients 110, a computer network 112, a server 108, a direct cache 120, a cache device 102, and a backing store 130. Other configurations of a system 100 are also possible and may similarly benefit from graceful cache degradation. Exemplary system 100 include, but are not limited to, a storage area network (SAN), network attached storage (NAS), a desktop computer, a laptop computer, or other computing environment which may beneficially implement a cache.

The clients 110 (also referred to as storage clients) are broadly defined as devices that send and receive requests for data. The clients may be computers (such as laptops, desktops, servers, mainframes, etc), mobile devices, or other categories of devices that send and receive digital data. The clients 110 may be directly connected to storage for the digital data (for example, by a bus) or may connected over a network (for example, the Internet).

The computer network 112 is a series of computers and devices connected by communications channels that facilitate communications between users of the attached devices. The network 112 may allow the users to share resources, such as storage. The network 112 may include, for example, network interface cards (NICs), repeaters, hubs, bridges, switches, routers, etc. The computer network 112 may be any of a large area network (LAN), wide area network (WAN), or other variety of computer network. The network 112 may be, for example, implemented in a data center, over the Internet, or in another environment. As noted above, in certain embodiments, the system 100 does not include a computer network 112.

The server 108 may be a workstation, a mainframe, a laptop, or other computing device. In certain embodiments, the server 108 has access to, and is communication with, the cache device 102 and the backing store 130. In certain embodiments, the server 108 manages communications between the clients 110 and the cache device 102 and the backing store 130. For example, the server 108 may be a storage manager. The server 108 may be directly connected to the cache device 102 (for example, via a bus), or indirectly connector (for example, via a network).

The server 108 may implement a file server to facilitate accessing and writing data to the cache device 102 and the backing store 130. The file server may manage files for the client 110. For example, clients 110 may direct the file server to read, write, delete, modify, or perform another operation for a particular file, object, logical block, or other data unit. The server 108 may view the cache device 102 and the backing store 130 as separate devices. The server 108 may also be presented with a view of unitary storage (such as a logical address space) with the existence and functioning of the cache device 102 hidden from the server 108.

The cache device 102 is a nonvolatile storage device that can store data digitally. The cache device 102 acts as a cache for the backing store 130, which is described below. In certain embodiments, the cache device 102 also includes a driver; in certain embodiments, the direct cache 120 may communicate directly with the cache device 102 without using an intermediate device driver for the cache device 102. For example, the direct cache 120 may interact with a VolumeManager (VM) either by polling or notification in order to determine when a backing store 130 is added to the system 100. In certain embodiments, the driver gets authorization to activate a direct cache 120 feature. The cache device 102 typically has faster access characteristics than those of the backing store 130; thus data can generally be read from the cache device 102 faster than data can be read from the backing store 130. The increased speed of the cache device 102 may result from the use of a cache device 102 that uses technology that is generally faster than that of the backing store (e.g., Flash memory cache device and hard disk drive backing store). The increase speed may also result from the nature of the connection; for example, the cache device 102 may be connected using a bus of the server 108 while the backing store 130 is connected using a slower network connection.

The cache device 102 may be realized as a card that connects to the PCIe bus of the server 108. In one embodiment, the cache device 102 is a solid state storage device implemented using NAND Flash memory. For example, the cache device 102 may be a solid state storage device such as those manufactured by Fusion-io®. In certain embodiments, the cache device 102 may comprise one or more physical devices that cooperate such that they serve as a single logical cache device; for example, multiple memory cards that attach to the PCIe bus of the server 108 may be used as the cache device 102. In such embodiments, the direct cache 120 may be configured to manage multiple physical devices that make up the cache device 102.

The backing store 130 provides storage for data in the system 100. The backing store 130 may comprise one or more devices. For example, the backing store 130 may be made up of hard disk drives, solid state storage, tape, or other nonvolatile media for storing data. The backing store 130 may be a SAN, a NAS, a RAID array, an ISCSI client, a JBOD, a volume or partition, or other storage device. In certain embodiments, the backing store 130 is a block device and interacts with the direct cache 120 by way of a block device interface.

The direct cache 120 enables graceful degradation of the cache device 102. The direct cache 120 may be implemented as a driver on the server 108, as software, as firmware, or as hardware. The caching device 120 may be implemented on the cache device 102. The caching device 120 may be a filter driver that interacts with the file system and/or operating system of a server 108, or other storage client 110 such as a database management system (DBMS). Components of the caching device 120 may also be distributed in the system 100. In certain embodiments, the direct cache 120 dynamically changes the cache policy implemented on the cache device 102 as the cache device experience wear out and failure. The cache policies may be implemented to provide the best data protection and cache performance possible in view of the health of the cache device 102.

The direct cache 120 may manage the use of the cache device 102 as a cache for data stored in the backing store 130. The direct cache 120 may implement any number of caching policies to make advantageous use of the faster access characteristics of the cache device 102. A caching policy specifies how data is written into, and read out of, the cache device 102 and the backing store 130. The cache policy may, for example, specify how the cache device 102 responds to read requests and/or write requests. The direct cache 120 may present a block device interface to storage clients such as the server 108. The server 108 may, in certain embodiments, interact with the direct cache 120 as it would with a standard block device. In certain embodiments, the direct cache 120 advertises to a storage client such as the server 108 an amount of storage capacity that is equal to the capacity of the backing store 130. In other embodiments, the direct cache 120 may advertise a storage capacity that is equal to the combined storage capacity of the cache device 102 and the backing store 130. In other embodiments, the direct cache 120 may present a sparse address space. The cache device 102 and backing store 130 may be transparent to the server 108, which may only see and interact with the direct cache 120.

The direct cache 120 may be configured to communicate with both the cache device 102 and the backing store 130. In certain embodiments, the direct cache 120 communicates commands like TRIM to the cache device 102. Commands may be sent in parallel to the cache device 102 and the backing store 130 when the commands are relevant to both. For example, where the cache device 102 and the backing store 130 are both solid state storage devices, the direct cache 120 may send TRIM commands to both the backing store 130 and the cache device 102.

In certain embodiments, the direct cache 120 determines the risk of data loss on the cache device 102, and determines that the risk of data loss exceeds a threshold risk level. The direct cache 120 may implement a modified cache policy for the cache device 102 if the direct cache 120 determines that the risk of data loss exceeds the threshold risk level. A modified cache policy chosen by the direct cache 120 is one that reduces the risk of data loss to below the threshold risk level. The direct cache 120 may dynamically determine the risk of data loss and dynamically adjust the cache policy of the cache device 102.

The direct cache 120 may determine the risk of data loss on the cache device 102 by monitoring the cache device 102 directly. The direct cache 120 may also determine the risk of data loss based on information given to it by the cache device 102; in certain embodiments, the cache device 102 reports the risk of data loss to the direct cache 120.

In certain embodiments, as the physical health of the cache device 102 decreases, the reliability of the cache device 102 also decreases (thus increasing the risk of data loss). For example, as Flash memory can grow increasingly unreliable and wear out completely as it is used over time. The direct cache 120 may gauge the physical health of the cache device 102 in determining the risk of data loss on the cache device 102. In certain embodiments, the cache device 102 reports metrics on physical health to the direct cache 120. In other embodiments, the direct cache 120 determines the heath of the cache device 102 directly. For example, the direct cache 120 may track the number of read and write operations executed by the cache device 102; the direct cache 120 may track the frequency of errors in data read from the cache device 102 corrected using error correction code (ECC); the direct cache 120 may track the frequency of errors in data read from the cache device 102 which cannot be corrected. Other approaches to monitoring and determining the physical health of a cache device 102 may also be used.

The direct cache 120 may dynamically adjust the caching policies for the system 100 in response to the changing risk of data loss on the cache device 102. For example, the direct cache 120 may dynamically adjust the cache policy as the cache device 102 ranges from a cache device state of fully operational to non-operational. As used herein, the term "non-operational" means that the cache device 102 is no longer capable of performing its primary function of caching data for the backing store 130. In addition, in certain embodiments, a non-operational cache device 102 may mean that the cache device 102 can no longer store data in a persistent manner. In certain embodiments, a non-operational cache device 102 may mean that the cache device 102 can no longer write new data in a manner that guarantees a threshold level of data reliability. In certain embodiments, a non-operational cache device 102 may mean that the cache device 102 has retired a sufficient number of storage cells of the non-volatile storage media 106 that there is no more storage capacity for new data (either user read misses or user writes). In other embodiments, a non-operational cache device 102 may mean that the cache device 102 is not communicating properly with a cache device driver 118, has lost power, has otherwise failed, or the like. The direct cache 120 may, for example, send all read and write requests to the backing store 130 and bypass the cache device 102 when the cache device 102 is non-operational. In certain embodiments, depending on the nature of the cache device 102 being non-operational, bypassing the cache device 102 may comprise sending read and write requests to the cache device 102 which then simply passes the requests on to the backing store 130. (e.g. the cache device 102 acts as a pass through component) These changes in cache policy may be hidden from the rest of the system 100 such that the server 108 and the clients 110 are unaware of the changes in the cache policy and the availability of the cache device 102. In certain embodiments, the cache device 102 is transparent to the server 108 and the clients 110.

As noted above, the direct cache 120 may determine that the risk of data loss on the cache device 102 exceeds a threshold risk level. The threshold risk level defines the maximum risk of data loss that is acceptable for the system 100. The way in which the threshold risk level may be implemented may vary. In one embodiment, the threshold risk level is a defined possibility of data loss; for example, the direct cache 120 may not tolerate a 2% risk of data loss. The direct cache 120 may implement various algorithms to determine a current risk of data loss for the direct cache 120, which can be compared against the threshold risk of data loss.

In other embodiments, the risk of data loss may be derived from a cache device state for the cache device 102. The direct cache 120 may define which caching policies are acceptable for a particular cache device state of the cache device 102. Examples of cache device states are given in FIG. 4. The direct cache 120 may determine that the risk of data loss exceeds a threshold risk level by determining that there is a change in the cache device state, and that the cache policy currently implemented on the cache device 102 is not acceptable for that particular cache device state. Such an approach is discussed in greater detail below. Other approaches may also be used to determine that the risk of data loss on the cache device 102 exceeds a threshold risk level.

The threshold risk level may be user defined, pre-defined by a manufacturer of the cache device 102, defined by a creator of the direct cache 120, or some combination thereof. For example, a user may define which caching policies are appropriate for which cache device states. The creator of the direct cache 120 may set defaults and recommend certain settings to the user.

The direct cache 120 may thereby allow the cache device 102 to gracefully degrade, adjusting the role of the cache device 102 as the cache device 102 ages and becomes increasingly unreliable. Thus, the direct cache 120 may adjust the role of the cache device 102 in the system 100 as it goes from a fully functional cache device 102 with no risk of data loss to non-operational. The role of the cache device 102 may be adjusted dynamically in response to the changes in the cache device state, and the changing role of the cache device 102 (as defined by the cache policies) may be hidden from the server 108 and the clients 110. Thus, the cache device 102 may initially take a vigorous role in the system 100 and, eventually, be bypassed completely when the cache device 102 becomes non-operational.

Figure 2:
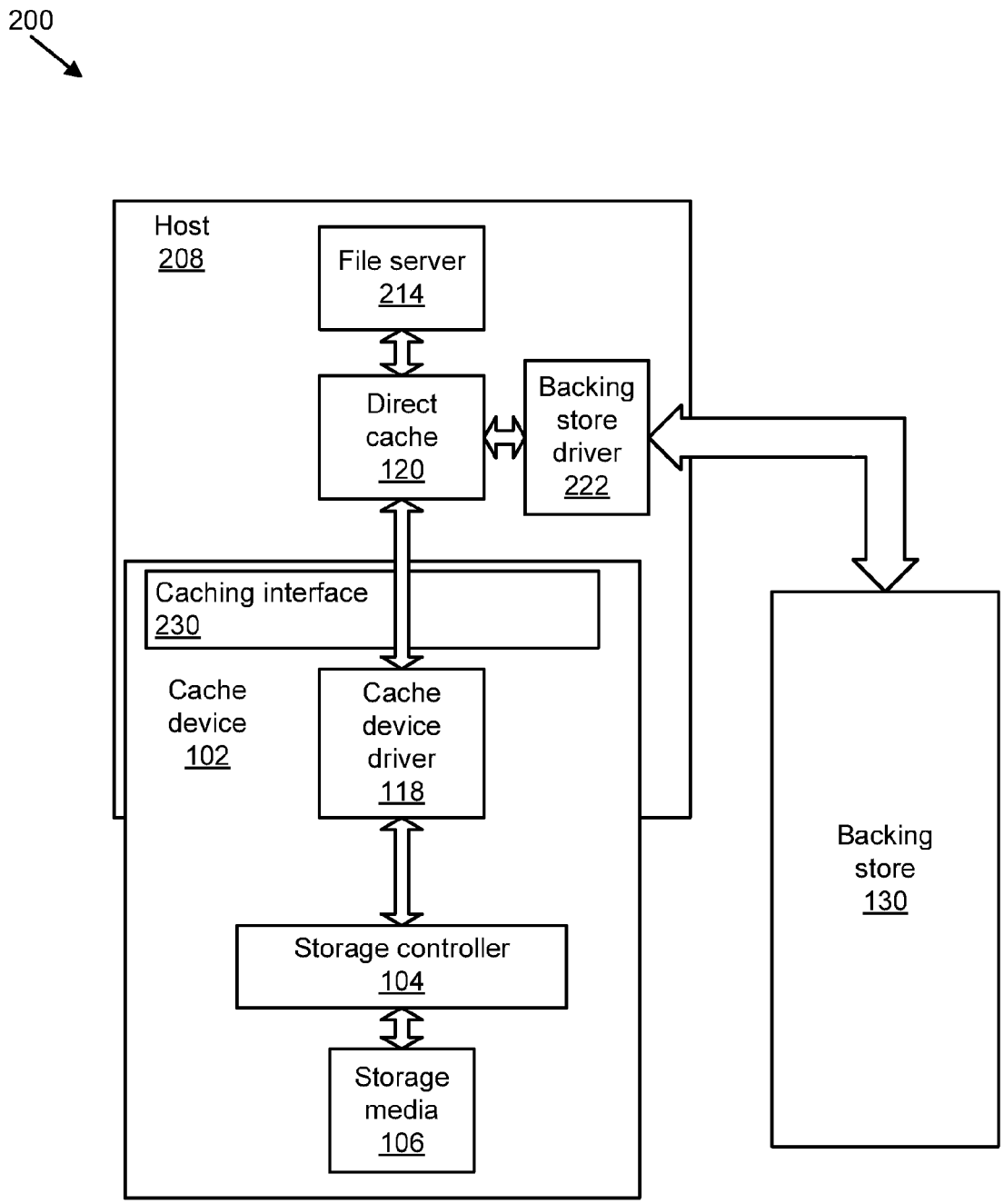
FIG. 2 is a second schematic block diagram illustrating one embodiment of a system with graceful cache degradation.

FIG. 2 presents a second embodiment of a system 200 which may benefit from graceful cache degradation. The system 200 includes a host 208, a file server 214, a direct cache 120, a backing store driver 222, a cache device 102, a caching interface 230, a cache device driver 118, a storage controller 104, and storage media 106. The system 200, in certain configurations, may include different elements than those shown in FIG. 2.

The host 208 may be a computer (such as a laptop, blade server, desktop, etc). In the depicted embodiment, both the cache device 102 and the backing store 130 may be directly attached to a bus of the host 208. The cache device 102 may be used as a cache for the backing store 130.

The file server 214 may facilitate writing and reading data in the system 200. The file server 214 may be a file system responsible for organizing blocks and maintaining an address system. For example, the file server 214 may associate file names with blocks of storage. The file server 214 may use a file allocation table (FAT) filing system, hierarchical file system (HFS) Plus, or other file management approach. The operating system on the host 208 may provide the file server 214. The file server 214 may communicate with the direct cache 120 using a storage interface.

The backing store driver 222 is a driver for the backing store 130. The direct cache 120 may invoke routines of the backing store driver 222 which, in response, may issue commands to the backing store 130. The backing store 130, in response, may send data back to the backing store driver 222, which in turn may send data to the direct cache 120 or otherwise invoke a routine in the direct cache 120. For example, the direct cache 120 may receive a write request from the file server 214, and determine that the data should be written to the backing store 130. The direct cache 120 may invoke routines of the backing store driver 222 causing it to issue commands to the backing store which result in the data being written on the physical storage media of the backing store 130. The backing store 130 may provide the backing store driver 222 with an acknowledgement (commonly referred to as an ACK) indicating that the data was successfully written. The backing store driver 222 may send this ACK to the direct cache 120. A similar process may be used for reads.

The direct cache 120 may similarly interface with a cache device driver 118 that is a driver for the cache device 102. The cache device driver 118 may be implemented as a driver on the host 208. In certain embodiments, the direct cache 120 may include the cache device driver 118. The direct cache 120 may also be configured to communicate directly with the storage controller 104 without an intermediate driver. The cache device driver 118 may be shared among multiple storage devices with individual storage controllers 104.

The storage controller 104 enables the storage and retrieval of data on the storage media 106. The storage controller 104 may perform various low-level operations necessary to write and read data from the storage media 106. The storage controller 104 may map logical identifiers to physical addresses on the storage media 106. The storage controller 104 may be a field programmable gate array (FPGA) such as a Xilinx® FPGA. The storage controller 104 may be an application specific integrated circuit (ASIC) or other customer logic solution. Various approaches may be used to create and configure a storage controller 104.

The storage media 106 is the physical media on which the data is stored. The storage media 106 may be disks, solid state media (such as NAND Flash), or other suitable storage media. In one embodiment, the storage media 106 is NAND Flash and is made up of banks of solid-state storage elements. The banks may be arranged in parallel. The cache device 102 may be configured to sequence execution of solid-state storage commands (such as reads and writes) such that a command of a first execution duration executes on a first bank concurrent with execution of a command of a second execution duration on a second bank. More detail on the possible arrangements of banks of solid-state storage can be found in U.S. patent application Ser. No. 11/952,095, entitled "Apparatus, System, and Method for Managing Commands of Solid-State Storage Using Bank Interleave" filed on Dec. 6, 2007 for David Flynn, Bert Lagerstedt, John Strasser, Jonathan Thatcher, and Michael Zappe, which application is hereby incorporated by reference.

The cache device 102 may also support error correcting code (ECC) chunks to protect data stored in the storage media 106. In certain embodiments, the cache device 102 generates ECC chunks comprising at least a portion of the received data, and an ECC code that is capable of correcting an error in the ECC chunk. The cache device 102 may store a portion of the ECC chunk on one solid-state storage element and also store a portion of the ECC chunk on a second solid-state storage element.

As noted above, the cache device 102 may interact with the direct cache 120 by way of a block device interface. The direct cache 120 and the cache device 102 may also interact using a caching interface 230. In certain embodiments, the caching interface 230 provides an interface by which the direct cache 120 may communicate with the cache device driver 118. In other embodiments, the direct cache 120 communicates with the storage controller 104 directly using the caching interface 230.

The caching interface 230 may provide support for various functions in support of graceful cache degradation. The cache interface 230 may provide the necessary support for reporting the risk of data loss on the cache device 102. For example, the cache interface 230 may allow the cache device 102 to report degrading cache device state.

The caching interface 230 may support reporting the actual physical capacity of the cache device 102. The reported actual physical capacity may exclude reserved amounts of capacity, such as the memory space necessary for reserve space and maintenance. Such a function may be used when the cache device 120 and cache device 102 support sparse addressing, and where the advertised storage is very large.

The caching interface 230 may also support reporting indicators that are associated with the risk of data loss on the cache device 102 and which can be used to determine the health of the cache device 102. The caching interface 230 may, for example, support reporting indicators such as the frequency of errors correctable using ECC, the frequency of errors uncorrectable using ECC, the number of read and write operations executed, and other indicators that are relevant to the health of the cache device 102. The cache interface 230 may further support the cache device 102 asynchronously reporting to the direct cache 120 when the cache device 102 transitions from one cache device state to another cache device state. In one embodiment, this is accomplished using a callback function. Other indicators may also be shared that are also associated with the risk of data loss on the cache device 102.

The caching interface 230 may also support advanced eviction features. In certain embodiments, the caching interface 230 allows the direct cache 120 to request that a cache member in the cache device 102 be evicted. The caching interface 230 may allow the cache device 102 to provide recommendations of which cache members to evict. In certain embodiments, the direct cache 120 simply tells the cache device 102 to evict cache members and allows the cache device 102 to determine which cache members to evict. The cache device 102 may determine which cache members are candidates for eviction based on the temperature of the cache member. The cache device 102 may also use efficiency related factors to determine cache members that are candidates for eviction. For example, where the cache device 102 is a solid state storage device, the cache device 102 may determine that cache members are candidates for eviction in order to make garbage collection more efficient. The cache device 102 may also make eviction decisions so as to maintain the highest possible write performance in the solid state storage device.

Figure 3:
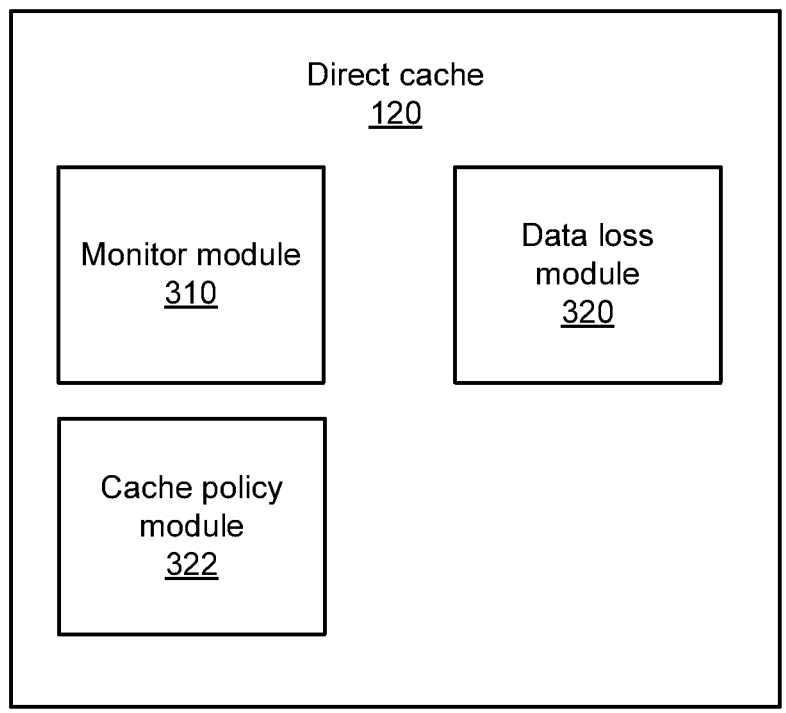
FIG. 3 is a schematic block diagram illustrating one embodiment of a direct cache for realizing graceful cache degradation.

FIG. 3 shows one embodiment of a direct cache 120 comprising a monitor module 310, a data loss module 320, and a cache policy module 322. In one embodiment, the monitor module 310 determines a risk of data loss on the cache device 102. Determining the risk of data loss may comprise gauging the physical health of the cache device 102. As described above, the cache device 102 may share information with the direct cache 120 that is relevant to the health of the cache device 102.

The monitor module 310 may also determine the cache device state of the cache device 102. For example, the cache device state may be "healthy", or may be "failure." In certain embodiments, determining the cache device state comprises the cache device 102 reporting the cache device state to the direct cache 120. The monitor module 310 may determine the risk of data loss in response to the cache device state. For example, if the cache device state is healthy, the monitor module 310 may determine that the risk of data loss is low.

The data loss module 320 may determine whether the risk of data loss on the cache device 102 exceeds a threshold risk level. As noted above, the data loss module 320 may do so by determining that the cache policy currently implemented on the cache device 102 is deemed too risky for the cache device state. Other approaches to determining whether the risk of data loss exceeds a threshold risk level may also be used.

The cache policy module 322 may implement a modified cache policy for the cache device 102 if the risk of data loss exceeds the threshold risk level. The cache policy module 322 may implement the modified cache policy dynamically. The change in cache policy may also be made transparently to the host 208 and the clients 110.

In certain embodiments, the multiple cache policies may reduce the risk of data loss below the threshold risk level. In such circumstances, the cache policy module 322 may select the modified cache policy that provides the highest level of cache functionality. Such a cache policy provides the best performance for the current risk of data loss associated with the cache device 102.

In certain embodiments, the cache policy module 322 contains the logic to implement the cache policy. The cache policy module 322 may, for example, be responsible for maintaining the data structures necessary to support the cache device 102. In one embodiment, the cache policy module 322 tracks clean and dirty data in the cache device 102. The cache policy module 322 may report dirty data to the cache device 102 such that the dirty data can be deleted. The cache policy module 322 may also report dirty data to the cache device 102 such that the dirty data can be marked as invalid (and therefore candidate for garbage collection) in cache devices 102 that are solid state storage devices. The validity map and the clean/dirty may be maintained in the direct cache 120, or may be maintained in the cache device 102, or a combination thereof.

The cache policy module 322 may also set the size of the cache members (also referred to in the art as cache lines). In certain embodiments, the user may adjust the size of the cache members. The size of the cache members may also be set by default by a maker of the direct cache 120. The size of the cache member may be a tunable attribute. In one embodiment, the size of the cache member may be set to be the same as the size of an erase unit size (such as the size of a logical erase block) such that entire erase blocks are marked invalid when cache members are evicted. Such an embodiment may increase the efficiency of the cache device 102 and optimize the cache device 102 for grooming. In other embodiments, the size of the cache member may be made much larger to minimize cache misses. The cache policy module 322 may also be configured to take efficiency of internal operations (such as grooming) into consideration when making decisions on which cache members to evict.

FIG. 4 includes two tables 410 and 420. The table 410 shows possible cache policies and the write and read behavior associated with the cache policies. The cache policies may include additional actions and detail than that shown in FIG. 4. In one embodiment, the cache policies include: a write back cache policy; a write through cache policy; a write around cache policy; a read only cache policy; and a bypass cache policy. The cache policies may further specify that the acknowledgement for a data write operation is sent when the data is preserved on a sufficiently stable storage device. In certain embodiments, writing the data to the cache device 102 will be sufficiently safe to merit sending an acknowledgement once the data is written to the cache device 102. In other embodiments, the acknowledgement is not sent until the data is written to the backing store 130.

In certain embodiments, the cache policy is a write back cache policy (also referred to as a copy back cache). Under such a policy, the direct cache 120 may direct write requests to the cache device 102 such that the data is written to the cache device 102. The data may be later migrated to the backing store 130. For example, the data may be moved to the backing store 130 when the cache member is evicted from the cache device 102 (an approach frequently called lazy write back). In such embodiments, the direct cache 120 may also track whether data written to the cache device 102 is clean or dirty to facilitate migrating data from the cache device 102 to the backing store 130. Other approaches to moving data from the cache device 102 to the backing store 130 (such as opportunistic write back) may also be used. For example, where the cache device 102 is a solid state storage device (such as a Flash device), evictions may be triggered as part of a grooming operation. Such a cache device 102 may be allowed to store data in circumstances that would not be advisable for a volatile storage device since the risk of data loss is very low for a Flash memory device in good condition. In the event that the cache device state changes, the direct cache 120 may cause all clean data to be migrated to the backing store 130; for example, the direct cache 120 may implement a modified cache policy that is a write through cache policy and, in preparation for the implementation of the modified cache policy, migrate all clean data that was stored under a write back cache policy.

In certain embodiments, under a write back cache policy, the acknowledgement is sent once the data is written to the cache device 102. The cache device 120 may be configured to provide an additional notification when the data is moved from the cache device 102 to the backing store 130. Reads may be executed against the cache device 102 such that, when the cache device 102 has the requested data, the read is performed from the cache device 102 and not the backing store 130.

The cache policy may also include a write through cache policy. Under a write through cache policy, data may be synchronously written to the cache device 102 and the backing store 130. In one embodiment, the cache device 120 ensures that the write request is executed against both the cache device 102 and the backing store 130 in a manner that is transparent to the host 208 or clients 110. In certain embodiments, the acknowledgement is sent when the data is written on the backing store 130, or when the data is written on both the backing store 130 and the cache device 102. Thus, in certain embodiments, the cache policy module 322, when implementing a write through cache policy, may send write requests to the cache device 102 and to the backing store 130, with acknowledgments being sent when the backing store 130 fulfills the request. The read policy associated with the write through cache policy may be identical to that described above for the write back cache policy.

The cache policy may also include a write around cache policy. In certain embodiments, the write around cache policy directs writes only to the backing store 130. Acknowledgements may be sent when the data is stored in the backing store 130. In one embodiment, the data coming from the clients 110 is not written to the cache device 102, but data may still be written to the cache device 102. For example, the cache device 120 may inject cache members into the cache device 102 from the backing store 130 even if data coming from the clients 110 is not written to the cache device 102. Thus, the cache policy module 322 may, when implementing a write around cache policy, send write requests exclusively to the backing store 130 such that the write requests bypass the cache device 102, with acknowledgements sent when the backing store 130 fulfills the write request. Reads may be executed against the cache device 102 as described above under the write around cache policy.

The cache policy may also include a read only cache policy. Under the read only cache policy, writes are directly only to the backing store 130. Acknowledgements may be sent when the data is stored in the backing store 130. Under the read only cache policy, the direct cache 120 may not inject cache members into the cache device 120. Reads may be executed against the cache device 102 as described above.

The cache policy may also include a bypass cache policy. Under the bypass cache policy, writes are directly only to the backing store 130. Acknowledgements may be sent when the data is stored in the backing store 130. Reads may be directed to the backing store 130 instead of the cache device 120. The cache policy module 322 may implement the bypass cache policy for the cache device 102 by sending write requests exclusively to the backing store 130, and by sending read requests exclusively to the backing store 130.

Table 420 displays one embodiment of a relationship between cache device state and cache functionality. Noted above, one way to determine that the risk of data loss on the cache device 102 exceeds a threshold risk level is to associate cache device states with permissible cache policies. Table 420 is one example of a possible association of cache device states and cache policies.

In one embodiment, the cache device state may be a "healthy" state. What constitutes a healthy state may vary based on the parameters set forth by a device manufacturer. In one embodiment, a healthy device may be defined by the likelihood of error. In some embodiments, a healthy device is defined by the number of spare chips or dies available to it for use when blocks go bad and need to be replaced. Other parameters may be used to specify when a cache device 102 is considered to be in a healthy cache device state.

In one embodiment, when the cache device state is healthy, the direct cache 120 may implement any of the possible cache policies. In certain embodiments, the default cache policy implemented for the cache device 102 in a healthy cache device state is the cache policy which maximizes performance. The choice of which cache policy to implement may be a user-tunable attribute. In one embodiment, the direct cache 120 implements a write back cache policy tuned to maximize input/output operations when the cache device 102 is in a healthy cache device state. As noted, under the write back policy, reads may be performed against the cache device 102 if the cache device 102 has the requested cache member.

In one embodiment, the cache device 102 may eventually degrade to a lesser cache device state. For example, a cache device 102 that is a Fusion-io NAND Flash memory device may degrade to a flashback mode where one or more spare chips or dies are in use on the cache device 102. In certain embodiments, the cache device 102 in the Flashback mode remains sufficiently reliable to implement any of the five cache policies shown in the table 410. The user may choose a conservative approach and implement a cache policy such as the write through cache policy to be implemented when the cache device 102 transitions to Flashback mode.

In certain embodiments, the cache device 102 reports when there is a change in the cache device state. The cache device 102 may communicate the change in the cache device state using the caching interface 230. In certain embodiments, the direct cache 120 may poll for changes in the cache device state. The cache device 102 may report a change in cache device state using an asynchronous notification.

In one embodiment, the cache device state also includes a write reduced mode. A cache device 102 may be in write reduced mode when the cache device 102 exhausts the available logical erase blocks (LEBs), which may result in slow writes. The cache policy module 322 may be configured to implement a modified cache policy in response to this change in cache device state; for example, the cache policy module 322 may implement the write through cache policy when the cache device 102 transitions to write reduced mode. The cache policy may alternatively be configured to implement the write around cache policy in response to the change.

In certain embodiments, multiple cache policies would reduce the risk of data loss below the threshold risk level. For example, in write reduced mode, the write through cache policy may sufficiently reduce the risk of data loss, as would the bypass cache policy. In certain embodiments, when multiple cache policies would sufficiently reduce the risk of data loss, the cache policy module 322 selects the cache policy that provides the highest level of cache functionality. Thus, while the bypass cache policy reduces the risk of data loss on the cache device 102 to zero (by logically removing the cache device 102), the cache policy module 322 would select the write around cache policy for implementation as the write around cache policy provides higher levels of cache functionality.

The cache device 102 may also have an associated read only mode. The read only mode may occur when there are sufficiently large numbers of errors in writing and/or reading data that writing data to the cache device 102 is not recommended. The maker of the direct cache 120 and/or cache device 102 may determine how frequent and severe errors must be before moving the cache device 102 into the read only mode cache device state. And, as above, the parameters for determining when the cache device 102 is in the read only mode may be configurable by a user. In one embodiment, the write around cache policy is associated with the read only mode cache device state. The cache policy module 322 may implement the write around cache policy for the cache device 102 to prevent data loss.

As noted above, the write around cache policy may allow for data to be injected as cache members into the cache device 102 from the backing store 130. Because such data is, by definition, stored on the backing store 130, even if the cache member is corrupted on the cache device 102 due to the degraded cache device state, there is no permanent loss of data. In the event that the injected cache member is corrupted, there may be a performance penalty in that the read operation on the cache device 102 fails, and the data ultimately has to be retrieved from the backing store 130.

In certain embodiments, the cache device 102 continues to degrade to such an extent that even injecting cache members into the cache device 102 is not advisable. In response, the cache policy module 322 may implement the read only cache policy for the cache device 102. In certain embodiments, the cache policy module 322 implements the read only cache policy when the cache device 102 is in the read only mode cache device state. The cache policy module 322 may monitor the error rates for injected cache members when the cache device 102 is in the read only mode and, once the error rates become large enough to assume that the injection is negatively impacting performance in the system, implement the read only cache policy.

In certain embodiments, the cache device state may be failure. The failure may be a hardware failure, software failure, or some combination thereof. The cache policy module 322 may, in response, implement the bypass cache policy which logically removes the cache device 102 from the system. Reads and writes are executed against the backing store 130 and not against the cache device 102.

When the risk of data loss on the cache device 102 is so high that the bypass cache policy is implemented for the cache device 102, the direct cache 120 may remove the cache device 102 from the software stack. In certain embodiments, the direct cache 120 remains in the call stack and routes all reads and writes to the backing store 130 without performing any cache-related functions. In certain embodiments, the direct cache 120 may be automatically removed and the backing store driver 222 put in its place. In certain embodiments, this may be accomplished through a reboot.

The tables in FIG. 4 are examples of how the cache policy for a cache device 102 may be altered to account for changes in the cache device state. Other approaches to determining the risk of data loss and adjusting the risk of data loss below a threshold level may also be used. In certain embodiments, these changes are made transparently to the host 208 and/or any clients 110. Thus, a cache device 102 may move through its life cycle and dynamically adjust the caching policy for the cache device 102 in order to protect data in the system 100. In certain embodiments, the only change from the perspective of clients 110 and a host 208 are changes in the amount of time necessary to execute read and write operations that result from the changing role of the cache device 102. As a result, a user may install a cache device 102 in a system 100 without committing to replacing the cache device 102 when it begins to degrade. In certain embodiments, the direct cache 120 may be configured to send a notification (such as an email, a system notification, or other) to the user when replacing the cache device 102 is recommended. The direct cache 120 may also provide updates to the user about the status of the cache device 102 and how the cache device 102's current state is affecting performance in the system 100.

Figure 5:
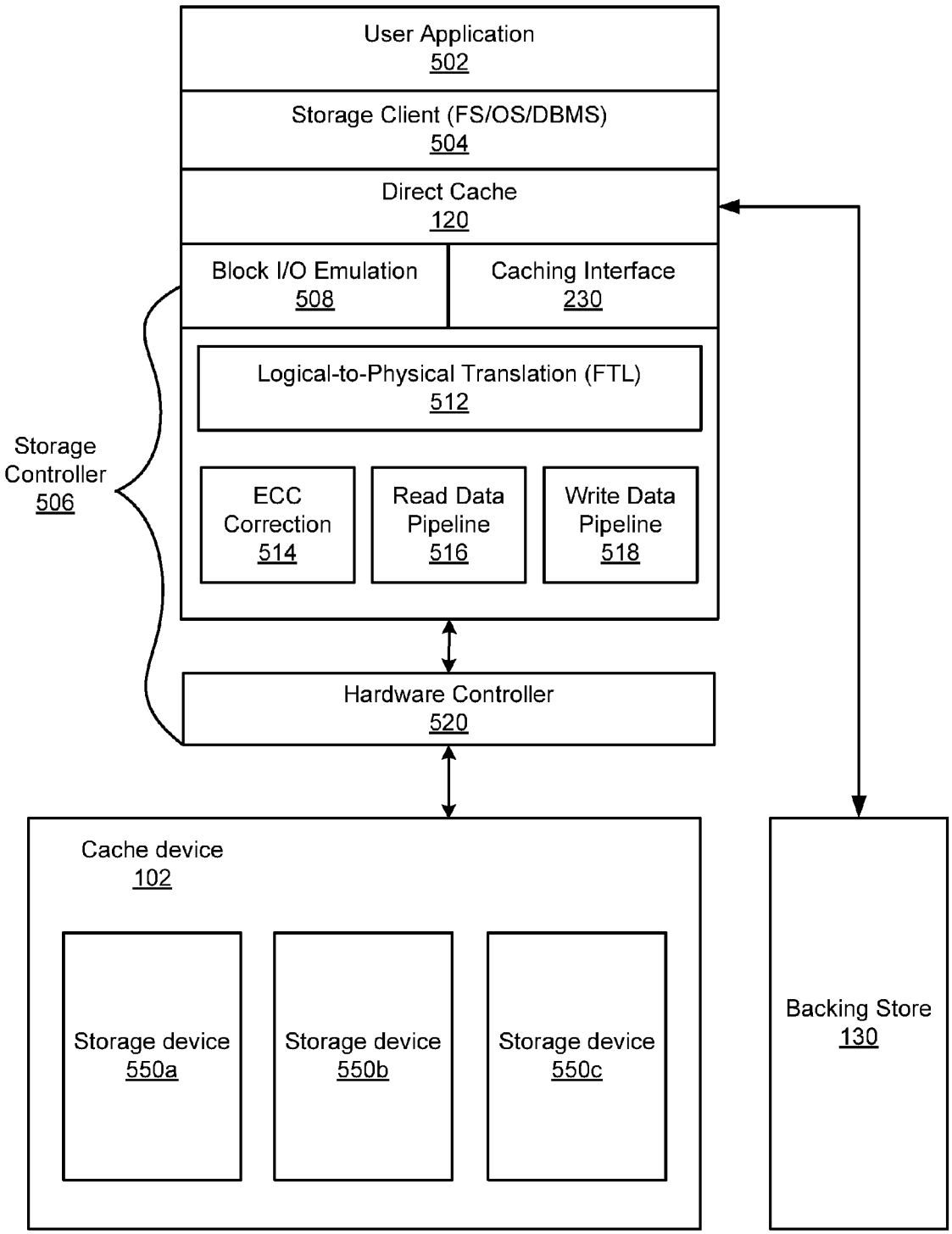
FIG. 5 is a schematic block diagram illustrating one embodiment of a software stack in a system with graceful cache degradation.

FIG. 5 is an illustration of one embodiment of a software stack representing an exemplary system in which a direct cache 120 and a cache device 102 may be implemented. The system 500 may include a user application 502, a storage client 504, a direct cache 120, a storage controller 506, a cache device 102 (including storage devices 550a-c), and a backing store 130.

User applications 502 may be any variety of application that may generate read and write requests. For example, the user application 502 may be a database management system (DBMS), a web browser, or other of the many varied applications that read and write data from storage. The storage client 504 manages file systems, files, data, and the like. The storage client 504 may be, for example, a server, a file system, an operating system, a volume manager, a DBMS, and the like. The user applications 502 may access the storage using the storage client 504.

The storage client 504 may be in communication with the direct cache 120. In certain embodiments, the direct cache 120 presents a block interface to the storage client 504 such that the direct cache 120 appears to be a standard block storage device. In one embodiment, the direct cache 120 communicates with the storage client 504 through an I/O interface represented by the block I/O emulation layer 508. The direct cache 120 may identify itself as a standard block device to the storage client 504. As noted above, the direct cache 120 may present a sparse address space to the storage client 504. The direct cache 120 may similarly ensure that the cache device 102 and the backing store 130 are transparent to the storage client 504. The direct cache 120 may similarly provide caching services in front of one or more physical devices (represented as storage devices 550a-c) that make up the cache device 102. The direct cache 120 may hide from the storage client 504 that there are multiple physical storage devices 550a-c (for example, multiple Fusion-io cards connected to a PCIe bus).

In certain embodiments, the direct cache 120 also interfaces with the cache device 102 (by way of the storage controller 506) using a block I/O emulation layer 508. The direct cache 120 may, for example, communicate with the cache device driver 118. In such embodiments, the direct cache 120 may be able to work with a variety of different cache devices 102 by communicating with the driver for the cache device 102 using conventional protocols. In other embodiments, the direct cache 120 may communicate directly with the storage controller 506 without an intermediate cache device driver 118.

As noted above, the direct cache 120 may communicate with the cache device 102 using a caching interface 230. The caching interface 230 may allow the direct cache 120 and the cache device 102 to exchange information that may be valuable in making decisions regarding the status of the cache device 102 (such as the cache device state), which cache members are candidates for eviction, and other parameters discussed above.

Certain conventional block storage devices divide the storage media into volumes or partitions. Each volume or partition may include a plurality of sectors. One or more sectors are organized into a logical block. In certain storage systems, such as those interfacing with the Windows® operating systems, the logical blocks are referred to as clusters. In other storage systems, such as those interfacing with UNIX, Linux, or similar operating systems, the logical blocks are referred to simply as blocks. A logical block or cluster represents a smallest physical amount of storage space on the storage media that is managed by the storage manager. A block storage device may associate n logical blocks available for user data storage across the storage media with a logical block address, numbered from 0 to n. In certain block storage devices, the logical block addresses may range from 0 to n per volume or partition. In conventional block storage devices, a logical block address maps directly to a particular logical block. In conventional block storage devices, each logical block maps to a particular set of physical sectors on the storage media.

The direct cache 120, the cache device 102, and/or the backing store 130 may not directly or necessarily associate logical block addresses with particular physical blocks. The direct cache 120, the cache device 102, and/or the backing store 130 may emulate a conventional block storage interface to maintain compatibility with block storage clients 504 and with conventional block storage commands and protocols.

A direct cache 120 may store data on the cache device 102 and/or the backing store 130 as blocks, sectors, pages, logical blocks, logical pages, erase blocks, logical erase blocks, ECC chunks or in any other format or structure advantageous to the technical characteristics of the cache device 102 and/or the backing store 130. For example, in one embodiment, the backing store 130 comprises a hard disk drive and the direct cache 120 stores data on the backing store as contiguous sectors of 512 bytes, or the like, using physical cylinder-head-sector addresses for each sector, logical block addresses for each sector, or the like. The direct cache 120 may receive a logical address and a command from the storage client 504 and perform the corresponding operation in relation to the cache device 102 and/or the backing store 130. The direct cache 120, the cache device 102, and/or the backing store 130 may support a block I/O emulation layer 508, a caching interface 230, or both a block I/O emulation layer 508 and a caching interface 230.

As described above, certain storage devices, while appearing to a storage client 504 to be a block storage device, do not directly associate particular logical block addresses with particular physical blocks, also referred to in the art as sectors. Such storage devices may use a logical-to-physical translation layer 512. The cache device 102 and the backing store 130 may each include a logical-to-physical translation layer 512. In another embodiment, the direct cache 120 maintains a single logical-to-physical translation layer 512 for the cache device 102 and the backing store 130. In another embodiment, the direct cache 120 maintains a distinct logical-to-physical translation layer 512 for each of the storage devices 550a-c and the backing store 130.

The logical-to-physical translation layer 512 provides a level of abstraction between the logical block addresses used by the storage client 504 and the physical block addresses at which the cache device 120 and the backing store 130 store the data. This mapping allows data to be referenced in a logical address space using logical identifiers, such as a logical block address. A logical identifier may not indicate the physical location of data in the cache device 102; a logical identifier may be an abstract reference to the data. For example, contiguous logical block addresses may be stored in non-contiguous physical block addresses as the logical-to-physical translation layer 512 determines the location on the physical media of the cache device 102 at which to perform data operations. The logical-to-physical translation layers 512 may each include a map or index that maps logical block addresses to physical block addresses. The map may be in the form of a b-tree, a content addressable memory (CAM), a binary tree, and/or a hash table, or the like. The logical-to-physical translation layer 512 may be a tree with nodes that represent logical block addresses and include references to corresponding physical block addresses.

The mapping module and the remapping module of FIG. 4 in U.S. patent application Ser. No. 12/847,952 (referenced and incorporated above), are one example of a logical-to-physical translation layer 510. A mapping module 724 and remapping module 730 are also explained in greater detail in connection with FIG. 7 below. The storage controller 506 may also include a read data pipeline 516 and a write data pipeline 518, which are also described in the aforementioned application. The write data pipeline 518 may be used to generate ECC check bits may be stored with the associated data packets to constitute ECC chunks. The ECC check bits may be used to detect and correct errors in the ECC chunk. The write data pipeline 518 may also include input buffers, write synchronization buffers, and write buffers to enable sequencing execution of solid-state storage commands as described above. The read data pipeline 516 may include an ECC correction module, a depacketizer, an alignment module, read synchronization buffers, output buffers, and other components described in the aforementioned application which may be used for ECC correction and sequencing execution of solid-state storage commands as described above.

As discussed above, the direct cache 120 may interface with drivers for the cache device 102 and the backing store 130. In certain embodiments, the caching algorithms are implemented at the direct cache 120 such that the direct cache 120 determines where read and write operations should be directed. Such an embodiment may prevent unnecessary traffic in the system by reducing duplicative and/or unnecessary commands directed to the backing store 130 and/or the cache device 102. Thus, the direct cache 120 may be responsible for injecting cache members from the backing store 130 into the cache device 102 and for evicting cache members from the cache device 102. As discussed above, the cache device 102 may, in certain embodiments, suggest cache members as candidates for eviction.

In certain embodiments, when the cache policy implemented in the system 500 is a bypass cache policy, read requests and write requests are sent to the backing store 130 exclusively and the cache device 102 is no longer used in the system. In such embodiments, the direct cache 120 may act simply as a pass-through component, forwarding all requests to the backing store driver 222. In certain implementations, the direct cache 120 may remove itself from the software stack when the cache policy is a bypass cache policy. In other embodiments, the direct cache 120 remains in the software stack in order to facilitate the introduction of a new cache device 102 into the system 500. The direct cache 120 may determine, after the introduction of the new cache device 102, that the risk of data loss on the cache device 102 is no longer so high that the bypass cache policy is necessary, and implement a cache policy that improves the performance of the system 500.

Figure 6:
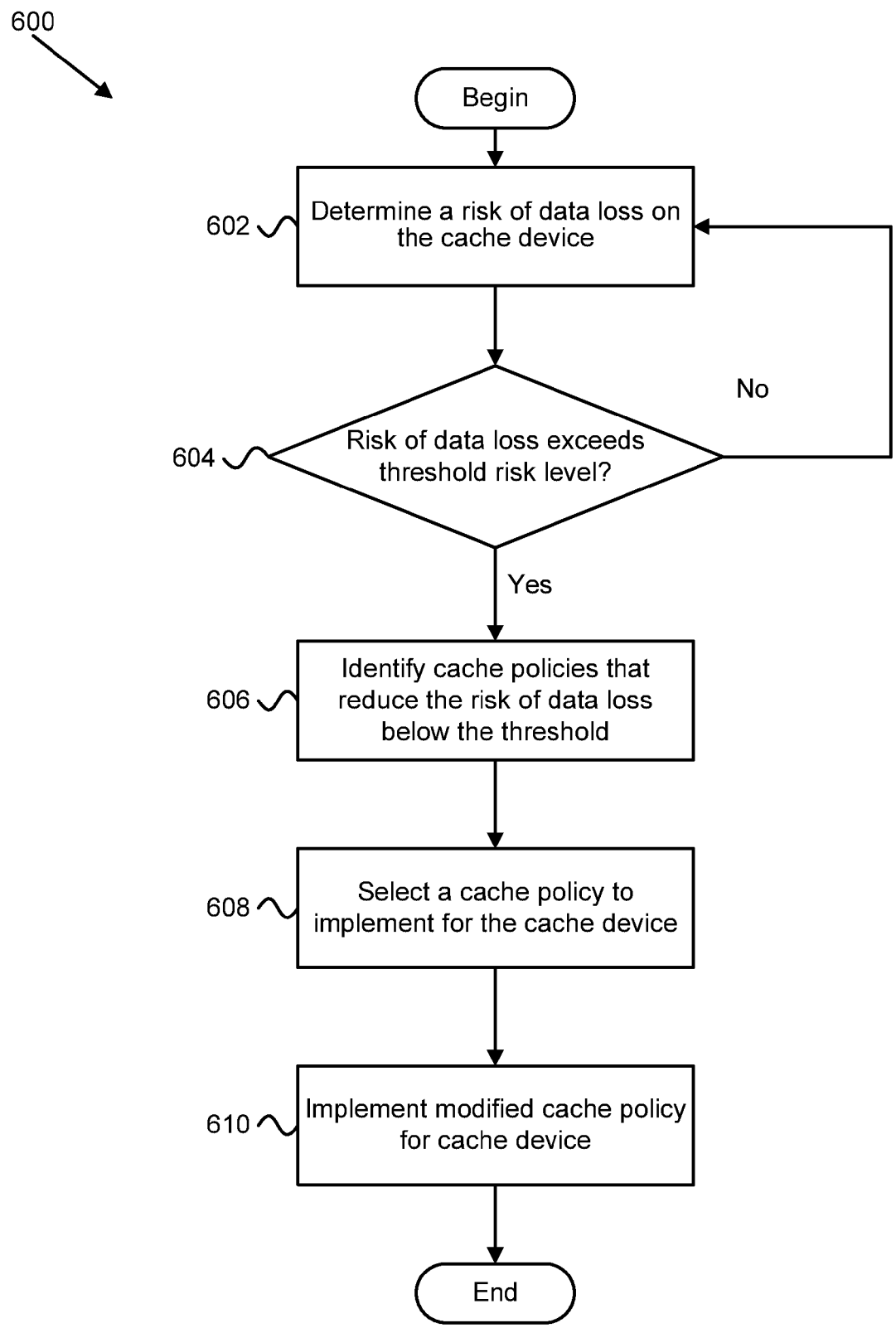
FIG. 6 is an illustrative flow chart diagram showing one embodiment of a method for realizing graceful cache degradation.

FIG. 6 is a figure showing one embodiment of a method 600 for graceful cache degradation. Other methods may be used, and the steps do not necessarily need to be performed in the depicted order. The method 600 may begin with determining 602 a risk of data loss on the cache device 102. As noted above, this step may be performed by a monitor module 310. Determining includes, but is not limited to, polling the cache device 102 for parameters that are indicative of a change in the risk of data loss and also includes listening for notifications sent from the cache device 102 to the direct cache 120. Thus, determining (as used in this application) encompasses both pulling information and receiving pushed information. In one embodiment, the risk of data loss is determined based on the cache device state.

The method 600 may also include the step of determining 604 whether the risk of data loss exceeds a threshold risk level. This step may involve determining the cache device state of the cache device 102 and determining the risk of data loss for the cache device 102 in response to the cache device state. Thus, the cache device state may be one or many parameters considered in determining the risk of data loss. Other parameters may include, for example, the error rate and the number of read and/or write operations executed on the cache device 102.

If the risk of data loss exceeds the threshold risk level, the method may further involve identifying 606 cache policies that reduce the risk of data loss below the threshold risk level. In some instances, more than one cache policy will reduce the risk of data loss below the threshold risk level. In such instances, the method may further involve selecting the cache policy that provides the highest level of cache functionality/performance. Regardless of whether there are multiple satisfactory cache policies, or only one, the method may involve selecting 608 a cache policy to implement for the cache device 102. The method may conclude with implementing 610 the modified cache policy, as selected at step 608, for the cache device 102. The risk of data loss is thus reduced to below the threshold risk level, and the method begins anew at step 602, with determining whether the cache device performance 102 has again degraded sufficiently to require implementation of a new cache policy. In certain embodiments, this method 600 continues to iterate until the cache device 102 cannot guarantee performance sufficient to justify its use in the system, and the cache device 102 is logically removed. As discussed above, this entire process of transitioning from a fully functional cache to no cache may be transparent to clients 110 and to the host 208.

Figure 7:
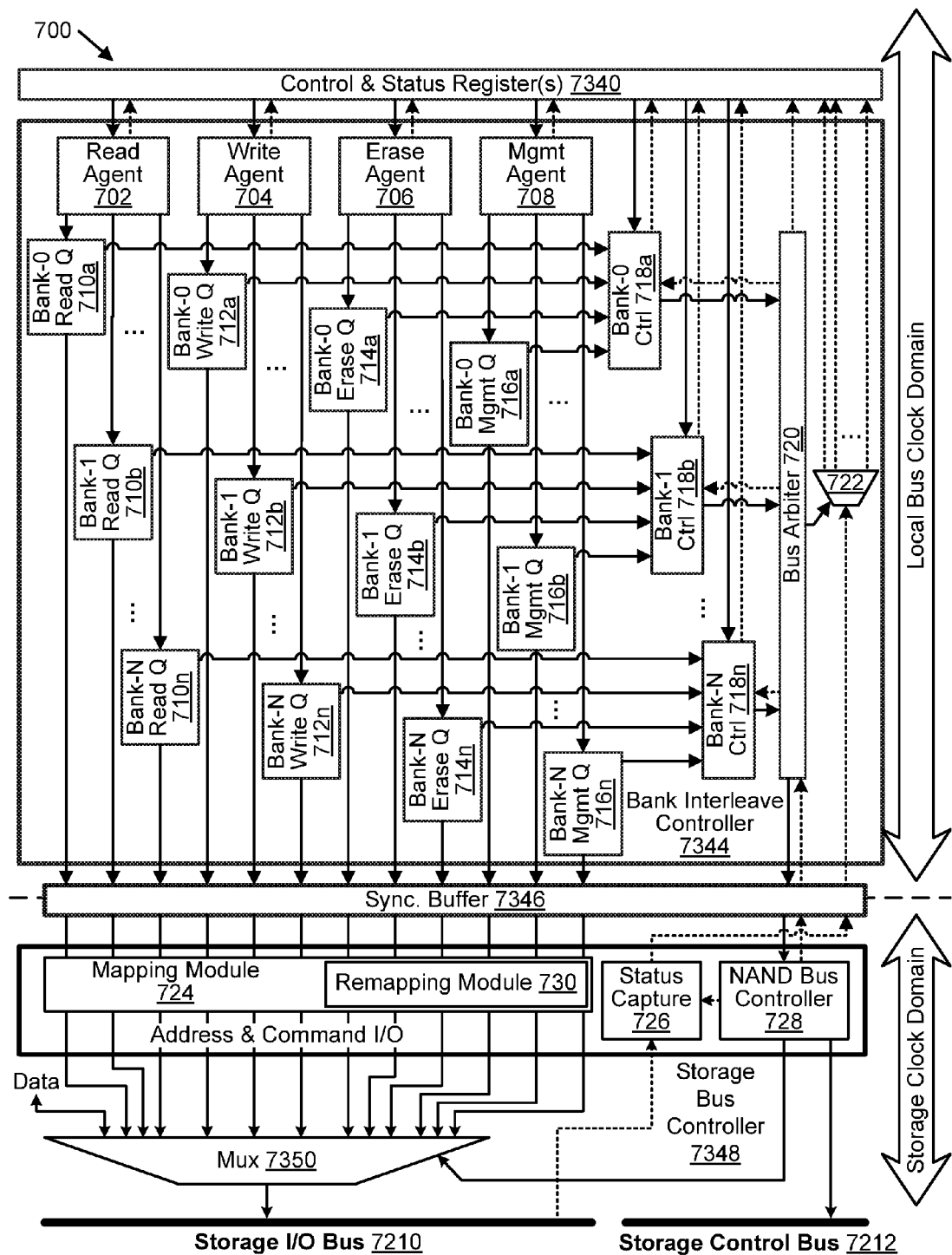
FIG. 7 is an illustrative block diagram of one embodiment of a mapping module and remapping module in a storage device.

FIG. 7 illustrates one embodiment of how a mapping module 724 and a remapping module 730 may operate.

Bank Interleave

FIG. 7 is a schematic block diagram illustrating one embodiment 700 of a bank interleave controller 7344 in the storage controller 104. The bank interleave controller 7344 is connected to the control and status registers 7340 and to the storage I/O bus 7210 and storage control bus 7212 through the MUX 7350, storage bus controller 7348, and synchronization buffer 7346, which are described below. The bank interleave controller 7344 includes a read agent 702, a write agent 704, an erase agent 706, a management agent 708, read queues 710a-n, write queues 712a-n, erase queues 714a-n, and management queues 716a-n for the banks in the solid-state storage media 106, bank controllers 718a-n, a bus arbiter 720, and a status MUX 722, which are described below. The storage bus controller 7348 includes a mapping module 724 with a remapping module 730, a status capture module 726, and a NAND bus controller 728, which are described below.

The bank interleave controller 7344 directs one or more commands to two or more queues in the bank interleave controller 7344 and coordinates among the banks of the storage media 106 execution of the commands stored in the queues, such that a command of a first type executes on one bank while a command of a second type executes on a second bank. The one or more commands are separated by command type into the queues. Each bank of the storage media 106 has a corresponding set of queues within the bank interleave controller 7344 and each set of queues includes a queue for each command type.

The bank interleave controller 7344 coordinates among the banks of the storage media 106 execution of the commands stored in the queues. For example, a command of a first type executes on one bank while a command of a second type executes on a second bank. Typically the command types and queue types include read and write commands and queues 710, 712, but may also include other commands and queues that are storage media specific. For example, in the embodiment depicted in FIG. 7, erase and management queues 714, 716 are included and would be appropriate for flash memory, NRAM, MRAM, DRAM, PRAM, etc.

For other types of storage media 106 (which is also referred to as solid-state storage media in connection with FIG. 7), other types of commands and corresponding queues may be included without straying from the scope of the invention. The flexible nature of an FPGA solid-state storage controller 104 allows flexibility in storage media. If flash memory were changed to another solid-state storage type, the bank interleave controller 7344, storage bus controller 7348, and MUX 7350 could be altered to accommodate the media type without significantly affecting the data pipelines 516, 518 and other storage controller 104 functions.

In the embodiment depicted in FIG. 7, the bank interleave controller 7344 includes, for each bank, a read queue 710 for reading data from the solid-state storage media 106, a write queue 712 for write commands to the solid-state storage media 106, an erase queue 714 for erasing an erase block in the solid-state storage, an a management queue 716 for management commands. The bank interleave controller 7344 also includes corresponding read, write, erase, and management agents 702, 704, 706, 708. In another embodiment, the control and status registers 7340 and control queues 7342 or similar components queue commands for data sent to the banks of the solid-state storage media 106 without a bank interleave controller 7344.

The agents 702, 704, 706, 708, in one embodiment, direct commands of the appropriate type destined for a particular bank to the correct queue for the bank. For example, the read agent 702 may receive a read command for bank-1 and directs the read command to the bank-1 read queue 710b. The write agent 704 may receive a write command to write data to a location in bank-0 of the solid-state storage media 106 and will then send the write command to the bank-0 write queue 712a. Similarly, the erase agent 706 may receive an erase command to erase an erase block in bank-1 214b and will then pass the erase command to the bank-1 erase queue 714b. The management agent 708 typically receives management commands, status requests, and the like, such as a reset command or a request to read a configuration register of a bank 214, such as bank-0 214a. The management agent 708 sends the management command to the bank-0 management queue 716a.

The agents 702, 704, 706, 708 typically also monitor status of the queues 710, 712, 714, 716 and send status, interrupt, or other messages when the queues 710, 712, 714, 716 are full, nearly full, non-functional, etc. In one embodiment, the agents 702, 704, 706, 708 receive commands and generate corresponding sub-commands. In one embodiment, the agents 702, 704, 706, 708 receive commands through the control & status registers 7340 and generate corresponding sub-commands which are forwarded to the queues 710, 712, 714, 716. One of skill in the art will recognize other functions of the agents 702, 704, 706, 708.

The queues 710, 712, 714, 716 typically receive commands and store the commands until required to be sent to the solid-state storage banks. In a typical embodiment, the queues 710, 712, 714, 716 are first-in, first-out ("FIFO") registers or a similar component that operates as a FIFO. In another embodiment, the queues 710, 712, 714, 716 store commands in an order that matches data, order of importance, or other criteria.

The bank controllers 718 typically receive commands from the queues 710, 712, 714, 716 and generate appropriate sub-commands. For example, the bank-0 write queue 712*a* may receive a command to write a page of data packets to bank-0. The bank-0 controller 718*a* may receive the write command at an appropriate time and may generate one or more write subcommands for each data packet stored in the write buffer to be written to the page in bank-0. For example, bank-0 controller 718*a* may generate commands to validate the status of bank 0 and the solid-state storage array, select the appropriate location for writing one or more data packets, clear the input buffers within the solid-state storage memory array, transfer the one or more data packets to the input buffers, program the input buffers into the selected location, verify that the data was correctly programmed, and if program failures occur do one or more of interrupting the master controller, retrying the write to the same physical location, and retrying the write to a different physical location. Additionally, in conjunction with example write command, the storage bus controller 7348 will cause the one or more commands to multiplied to each of the each of the storage I/O buses with the logical address of the command mapped to a first physical addresses for storage I/O bus, and mapped to a second physical address for storage I/O bus, and so forth as further described below.

Typically, bus arbiter 720 selects from among the bank controllers 718 and pulls subcommands from output queues within the bank controllers 718 and forwards these to the storage bus controller 7348 in a sequence that optimizes the performance of the banks. In another embodiment, the bus arbiter 720 may respond to a high level interrupt and modify the normal selection criteria. In another embodiment, the master controller can control the bus arbiter 720 through the control and status registers 7340. One of skill in the art will recognize other means by which the bus arbiter 720 may control and interleave the sequence of commands from the bank controllers 718 to the solid-state storage media 106.

The bus arbiter 720 typically coordinates selection of appropriate commands, and corresponding data when required for the command type, from the bank controllers 718 and sends the commands and data to the storage bus controller 7348. The bus arbiter 720 typically also sends commands to the storage control bus 7212 to select the appropriate bank. For the case of flash memory or other solid-state storage media 106 with an asynchronous, bi-directional serial storage I/O bus 7210, only one command (control information) or set of data can be transmitted at a time. For example, when write commands or data are being transmitted to the solid-state storage media 106 on the storage I/O bus 7210, read commands, data being read, erase commands, management commands, or other status commands cannot be transmitted on the storage I/O bus 7210. For example, when data is being read from the storage I/O bus 7210, data cannot be written to the solid-state storage media 106.

For example, during a write operation on bank-0 the bus arbiter 720 selects the bank-0 controller 718*a* which may have a write command or a series of write sub-commands on the top of its queue which cause the storage bus controller 7348 to execute the following sequence. The bus arbiter 720 forwards the write command to the storage bus controller 7348, which sets up a write command by selecting bank-0 through the storage control bus 7212, sending a command to clear the input buffers of the solid-state storage elements 106 associated with the bank-0, and sending a command to validate the status of the solid-state storage elements associated with the bank-0. The storage bus controller 7348 then transmits a write subcommand on the storage I/O bus 7210, which contains the physical addresses including the address of the logical erase block for each individual physical erase solid-stage storage element as mapped from the logical erase block address. The storage bus controller 7348 then muxes the write buffer 320 through the write sync buffer 308 to the storage I/O bus 7210 through the MUX 7350 and streams write data to the appropriate page. When the page is full, then storage bus controller 7348 causes the solid-state storage elements associated with the bank-0 to program the input buffer to the memory cells within the solid-state storage elements. Finally, the storage bus controller 7348 validates the status to ensure that page was correctly programmed.

A read operation is similar to the write example above. During a read operation, typically the bus arbiter 720, or other component of the bank interleave controller 7344, receives data and corresponding status information and sends the data to the read data pipeline 516 while sending the status information on to the control and status registers 7340. Typically, a read data command forwarded from bus arbiter 720 to the storage bus controller 7348 will cause the MUX 7350 to gate the read data on storage I/O bus 7210 to the read data pipeline 516 and send status information to the appropriate control and status registers 7340 through the status MUX 422.

The bus arbiter 720 coordinates the various command types and data access modes so that only an appropriate command type or corresponding data is on the bus at any given time. If the bus arbiter 720 has selected a write command, and write subcommands and corresponding data are being written to the solid-state storage media 106, the bus arbiter 720 will not allow other command types on the storage I/O bus 7210. Beneficially, the bus arbiter 720 uses timing information, such as predicted command execution times, along with status information received concerning bank status to coordinate execution of the various commands on the bus with the goal of minimizing or eliminating idle time of the busses.

The master controller through the bus arbiter 720 typically uses expected completion times of the commands stored in the queues 710, 712, 714, 716, along with status information, so that when the subcommands associated with a command are executing on one bank, other subcommands of other commands are executing on other banks. When one command is fully executed on a bank, the bus arbiter 720 directs another command to the bank. The bus arbiter 720 may also coordinate commands stored in the queues 710, 712, 714, 716 with other commands that are not stored in the queues 710, 712, 714, 716.

For example, an erase command may be sent out to erase a group of erase blocks within the solid-state storage media 106. An erase command may take 10 to 1000 times more time to execute than a write or a read command or 10 to 100 times more time to execute than a program command. For N banks, the bank interleave controller 7344 may split the erase command into N commands, each to erase a virtual erase block of a bank. While bank-0 is executing an erase command, the bus arbiter 720 may select other commands for execution on the other banks. The bus arbiter 720 may also work with other components, such as the storage bus controller 7348, the master controller, etc., to coordinate command execution among the buses. Coordinating execution of commands using the bus arbiter 720, bank controllers 718, queues 710, 712, 714, 716, and agents 702, 704, 706, 708 of the bank interleave controller 7344 can dramatically increase performance over other solid-state storage systems without a bank interleave function.

In one embodiment, the solid-state controller 104 includes one bank interleave controller 7344 that serves all of the storage elements of the solid-state storage media 106. In another embodiment, the solid-state controller 104 includes a bank interleave controller 7344 for each column of storage elements. For example, one bank interleave controller 7344 serves one column of storage elements, a second bank interleave controller 7344 serves a second column of storage elements, etc.

Storage-Specific Components

The solid-state storage controller 104 includes a synchronization buffer 7346 that buffers commands and status messages sent and received from the solid-state storage media 106. The synchronization buffer 7346 is located at the boundary between the solid-state storage clock domain and the local bus clock domain and provides buffering to account for the clock domain differences. The synchronization buffer 7346, write synchronization buffer, and read synchronization buffer may be independent or may act together to buffer data, commands, status messages, etc. In one embodiment, the synchronization buffer 7346 is located where there are the fewest number of signals crossing the clock domains. One skilled in the art will recognize that synchronization between clock domains may be arbitrarily moved to other locations in order to optimize some aspect of design implementation.

The solid-state storage controller 104 may include a storage bus controller 7348 that interprets and translates commands for data sent to and read from the solid-state storage media 106 and status messages received from the solid-state storage media 106 based on the type of solid-state storage media 106. For example, the storage bus controller 7348 may have different timing requirements for different types of storage, storage with different performance characteristics, storage from different manufacturers, etc. The storage bus controller 7348 also sends control commands to the storage control bus 7212.

In one embodiment, the solid-state storage controller 104 includes a MUX 7350 that comprises an array of multiplexers 7350*a-n* where each multiplexer is dedicated to a row in the solid-state storage array 106. For example, multiplexer 7350*a* is associated with solid-state storage elements 216*a*, 218*a*, 220*a*. MUX 7350 routes the data from the write data pipeline 518 and commands from the storage bus controller 7348 to the solid-state storage media 106 via the storage I/O bus 7210 and routes data and status messages from the solid-state storage media 106 via the storage I/O bus 7210 to the read data pipeline 516 and the control and status registers 7340 through the storage bus controller 7348, synchronization buffer 7346, and bank interleave controller 7344.

In one embodiment, the solid-state storage controller 104 includes a MUX 7350 for each row of solid-state storage elements (e.g. SSS 0.1 216*a*, SSS 0.2 218*a*, SSS 0.N 220*a*). A MUX 7350 combines data from the write data pipeline 518 and commands sent to the solid-state storage media 106 via the storage I/O bus 7210 and separates data to be processed by the read data pipeline 516 from commands. Packets stored in the write buffer are directed on busses out of the write buffer through a write synchronization buffer for each row of solid-state storage elements to the MUX 7350 for each row of solid-state storage elements. The commands and read data are received by the MUXes 7350 from the storage I/O bus 7210. The MUXes 7350 also direct status messages to the storage bus controller 7348.

The storage bus controller 7348 includes a mapping module 724. The mapping module 724 maps a logical address of an erase block to one or more physical addresses of an erase block. For example, a solid-state storage media 106 with an array of twenty storage elements per block may have a logical address for a particular erase block mapped to twenty physical addresses of the erase block, one physical address per storage element. Because the storage elements are accessed in parallel, erase blocks at the same position in each storage element in a row of storage elements will share a physical address. To select one erase block instead of all erase blocks in the row, one bank is selected.

This logical-to-physical mapping for erase blocks is beneficial because if one erase block becomes damaged or inaccessible, the mapping can be changed to map to another erase block. This mitigates the loss of losing an entire virtual erase block when one element's erase block is faulty. The remapping module 730 changes a mapping of a logical address of an erase block to one or more physical addresses of a virtual erase block (spread over the array of storage elements). For example, virtual erase block 1 may be mapped to erase block 1 of storage element SSS 0.0 216*a*, to erase block 1 of storage element SSS 1.0 216*b*, . . . , and to storage element M.0 216*m*, virtual erase block 2 may be mapped to erase block 2 of storage element SSS 0.1 218*a*, to erase block 2 of storage element SSS 1.1 218*b*, . . . , and to storage element M.1 218*m*, etc. Alternatively, virtual erase block 1 may be mapped to one erase block from each storage element in an array such that virtual erase block 1 includes erase block 1 of storage element SSS 0.0 216*a* to erase block 1 of storage element SSS 1.0 216*b* to storage element M.0 216*m*, and erase block 1 of storage element SSS 0.1 218*a* to erase block 1 of storage element SSS 1.1 218*b*, . . . , and to storage element M.1 218*m*, for each storage element in the array up to erase block 1 of storage element M.N 220*m*.

If erase block 1 of a storage element SSS0.0 216*a* is damaged, experiencing errors due to wear, etc., or cannot be used for some reason, the remapping module 730 could change the logical-to-physical mapping for the logical address that pointed to erase block 1 of virtual erase block 1. If a spare erase block (call it erase block 221) of storage element SSS 0.0 216*a* is available and currently not mapped, the remapping module 730 could change the mapping of virtual erase block 1 to point to erase block 221 of storage element SSS 0.0 216*a*, while continuing to point to erase block 1 of storage element SSS 1.0 216*b*, erase block 1 of storage element SSS 2.0 (not shown), and to storage element M.0 216*m*. The mapping module 724 or remapping module 730 could map erase blocks in a prescribed order (virtual erase block 1 to erase block 1 of the storage elements, virtual erase block 2 to erase block 2 of the storage elements, etc.) or may map erase blocks of the storage elements 216, 218, 220 in another order based on some other criteria.

In one embodiment, the erase blocks could be grouped by access time. Grouping by access time, meaning time to execute a command, such as programming (writing) data into pages of specific erase blocks, can level command completion so that a command executed across the erase blocks of a virtual erase block is not limited by the slowest erase block. In other embodiments, the erase blocks may be grouped by wear level, health, etc. One of skill in the art will recognize other factors to consider when mapping or remapping erase blocks.

In one embodiment, the storage bus controller 7348 includes a status capture module 726 that receives status messages from the solid-state storage media 106 and sends the status messages to the status MUX 722. In another embodiment, when the solid-state storage media 106 is flash memory, the storage bus controller 7348 includes a NAND bus controller 728. The NAND bus controller 728 directs commands from the read and write data pipelines 518, 516 to the correct location in the solid-state storage media 106, coordinates timing of command execution based on characteristics of the flash memory, etc. If the solid-state storage media 106 is another solid-state storage type, the NAND bus controller 728 would be replaced by a bus controller specific to the storage type. One of skill in the art will recognize other functions of a NAND bus controller 728.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for caching using a nonvolatile storage device, the method comprising:
    determining a risk of data loss on a cache device, wherein the cache device is a non-volatile storage device configured to perform cache functions for a backing store and implements a cache policy;
    determining that the risk of data loss on the cache device exceeds a threshold risk level; and
    implementing a modified cache policy for the cache device in response to the risk of data loss exceeding the threshold risk level, the modified cache policy reducing the risk of data loss below the threshold risk level.

2. The method of claim 1, wherein the cache policy specifies how the cache device responds to one or more of read requests and write requests.

3. The method of claim 1, wherein determining the risk of data loss comprises gauging a physical health of the cache device, and wherein the risk of data loss increases as the physical health of the cache device degrades.

4. The method of claim 1, further comprising identifying a plurality of cache policies that reduce the risk of data loss below the threshold risk level, and selecting a modified cache policy that provides a highest level of cache functionality from the plurality of cache policies.

5. The method of claim 1, wherein implementing the modified cache policy for the cache device comprises dynamically implementing the modified cache policy that reduces the risk of data loss below the threshold risk level.

6. The method of claim 5, wherein the modified cache policy reduces the risk of data loss by ensuring that data associated with write requests is preserved on the backing store.

7. The method of claim 1, wherein the modified cache policy is one of: a write through cache policy; a write around cache policy; a read only cache policy; and a bypass cache policy.

8. The method of claim 1, wherein the cache device is a solid state storage device having a plurality of banks of solid-state storage elements, wherein the cache device sequences execution of solid-state storage commands such that a first command of a first execution duration executes on a first bank concurrently with execution of a second command of a second execution duration on a second bank.

9. The method of claim 8, wherein the cache device generates an error-correcting code (ECC) chunk comprising at least a portion of received data and an ECC code capable of correcting an error in the ECC chunk, and wherein the cache device further stores a first portion of the ECC chunk on a first solid-state storage element and a second portion of the ECC chunk on a second solid-state storage element.

10. The method of claim 1, wherein the cache device comprises a plurality of physical devices cooperating such that the plurality of physical devices serve as a single logical cache device.

11. The method of claim 1, further comprising:
    determining a cache device state of the cache device; and
    determining the risk of data loss for the cache device in response to the cache device state.

12. An apparatus for caching using a nonvolatile storage device, the apparatus comprising:
    a direct cache configured for communication with a cache device and a backing store, wherein the cache device is a non-volatile storage device configured to perform cache functions for the backing store, the direct cache comprising:
        a monitor module configured for determining a risk of data loss on
            the cache device;
        a cache policy module configured for implementing a modified cache policy for the cache device if a risk of data loss on the cache device exceeds a threshold risk level; and
    wherein the direct cache is configured to recieve, from the cache device,
        one or more indicators associated with the risk of data loss on the cache device.

13. The apparatus of claim 12, wherein the cache policy module is further configured to send write requests to the cache device, send the write requests to the backing store, and receive acknowledgements in response to the backing store fulfilling the write requests.

14. The apparatus of claim 12, wherein the cache policy module is further configured to send write requests exclusively to the backing store such that the write requests bypass the cache device and to receive acknowledgements in response to the backing store fulfilling the write requests.

15. The apparatus of claim 14, wherein the cache policy module is further configured to first direct read requests to the cache device for fulfillment.

16. The apparatus of claim 12, wherein the cache policy module is further configured to bypass the cache device such that write requests are sent exclusively to the backing store, and such that read requests are sent exclusively to the backing store.

17. The apparatus of claim 12, wherein the direct cache communicates with the cache device using a caching interface.

18. The apparatus of claim 12, wherein the direct cache is a stand-alone driver.

19. A system for caching using a nonvolatile storage device, the system comprising:
    a backing store configured for storing data received from one or more storage clients,
        wherein the backing store comprises one or more non-volatile storage devices;
    a cache device configured for performing cache functions for the backing store,
        wherein the cache device is a non-volatile storage device with faster access characteristics than those of the backing store, and wherein the cache device is configured to implement a cache policy;

a direct cache configured for:
- determining a risk of data loss on the cache device;
- determining that the risk of data loss on the cache device exceeds a threshold risk level; and
- implementing a modified cache policy for the cache device in response to the risk of data loss exceeding the threshold risk level, the modified cache policy reducing the risk of data loss below the threshold risk level.

20. The system of claim 19, wherein the direct cache is configured to communicate with the cache device using a caching interface.

21. The system of claim 19, wherein the cache policy specifies how the cache device responds to one or more of read requests and write requests received from the one or more storage clients.

22. The system of claim 19, wherein the modified cache policy reduces the risk of data loss by ensuring that data associated with write requests is preserved on the backing store.

* * * * *